US012730949B2

(12) United States Patent
Hoover

(10) Patent No.: US 12,730,949 B2
(45) Date of Patent: Sep. 8, 2026

(54) SYSTEM AND METHOD FOR ELECTRONIC CIRCUIT EMULATION

(71) Applicant: Steven F. Hoover, Shrewsbury, MA (US)

(72) Inventor: Steven F. Hoover, Shrewsbury, MA (US)

( * ) Notice: Subject to any disclaimer, the term of this patent is extended or adjusted under 35 U.S.C. 154(b) by 1049 days.

(21) Appl. No.: 17/893,156

(22) Filed: Aug. 22, 2022

(65) Prior Publication Data

US 2023/0059335 A1 Feb. 23, 2023

Related U.S. Application Data

(60) Provisional application No. 63/235,287, filed on Aug. 20, 2021, provisional application No. 63/235,283, filed on Aug. 20, 2021.

(51) Int. Cl.
*G06F 30/323* (2020.01)
*G06F 30/327* (2020.01)
*G06F 30/3308* (2020.01)

(52) U.S. Cl.
CPC ........ *G06F 30/323* (2020.01); *G06F 30/3308* (2020.01); *G06F 30/327* (2020.01)

(58) Field of Classification Search
CPC ... G06F 30/323; G06F 30/3308; G06F 30/327
USPC .......................................................... 716/103
See application file for complete search history.

(56) References Cited

U.S. PATENT DOCUMENTS 5,872,953 A * 2/1999 Bailey .................. G06F 30/331 703/16
7,506,286 B2 * 3/2009 Beardslee ............... G06F 30/33 716/136
8,082,530 B1 * 12/2011 Ou ........................ G06F 30/367 716/109
8,667,449 B2 * 3/2014 Gunasekar .......... G06F 30/3312 716/108
8,769,450 B1 * 7/2014 Tian .................... G06F 30/3323 716/103
9,305,126 B2 * 4/2016 Selvidge ............. G06F 30/3312
9,817,931 B1 * 11/2017 Gu ...................... G06F 30/3308
10,586,003 B1 * 3/2020 Suresh .................... G06F 30/30
2006/0195822 A1 * 8/2006 Beardslee ...... G01R 31/318357 717/124
2011/0307233 A1 * 12/2011 Tseng .................... G06F 30/347 703/21
2022/0108056 A1 * 4/2022 Biswas ................. G06F 30/323

(Continued)

OTHER PUBLICATIONS

Jeong, et al. "A Time Division Multiplexing (TDM) Logic Mapping Method for Computational Applications", ICCSA 2007, LNCS 4705, Part I, pp. 1096-1106.

(Continued)

*Primary Examiner* — Suchin Parihar
(74) *Attorney, Agent, or Firm* — Pierce Atwood LLP

(57) ABSTRACT

A system and method transforms a model of electronic circuit to improve emulation speed and/or reduce emulation area. The model may be divided into partitions; a sequence of storage elements may be created on a partition boundary to allow a partition to process the contents of the storage elements. The disposition of the sequence may correspond to a connection between hardware emulation elements to compensate for latencies therebetween.

14 Claims, 32 Drawing Sheets

(56) References Cited

U.S. PATENT DOCUMENTS

2023/0060111 A1* 2/2023 Hoover ................. G06F 30/323

OTHER PUBLICATIONS

Hoover, et al. "Top-Down Transaction-Level Design with TL-Verilog", Nov. 5, 2018, arXiv:1811.01780.
Hoover, "Timing-Abstract Circuit Design in Transaction-Level Verilog", 2017 IEEE International Conference on Computer Design (ICCD), 2017, pp. 525-532, doi: 10.1109/ICCD.2017.91.
D. Rosenband, J. Schwartz and Arvind, "Modular scheduling of guarded atomic actions", 41st Design Automation Conference (DAC), 2004.
F. Gruian and M. Westmijze, "VHDL vs. Bluespec system verilog: a case study on a Java embedded architecture", Proc. of the 2008 ACM Symposium on Applied Computing, pp. 1492-1497, Mar. 2008.
J. Bachrach et al., "Chisel: Constructing Hardware in a Scala Embedded Language", Proc. of the 49th Design Automation Conference, Jun. 2012.
C. E. Leiserson, F. Rose and J. B. Saxe, "Optimizing synchronous circuitry by retiming", Proc. of the 3rd Caltech Conference on VLSI, Mar. 1983.
B. Lockyear and C. Ebeling, "Optimal Retiming of Multi-Phase Level-Clocked Circuits", Advanced Research in VLSI and Parallel Systems: Proc. of the Brown/MIT Conference, pp. 265-280, 1992.
E. Nurvitadhi, Automatic Pipeline Synthesis and Formal Verification from Transactional Datapath Specifications, 2010.

* cited by examiner

Hardware-Based Emulator 108
Software-Based Hardware Interface Component 160
Programmable Hardware Component 1 162a
Programmable Hardware Component 2 162b
Programmable Hardware Component N 162N
Hardware Component Connection 164
Hardware Component Connections 166
...
...

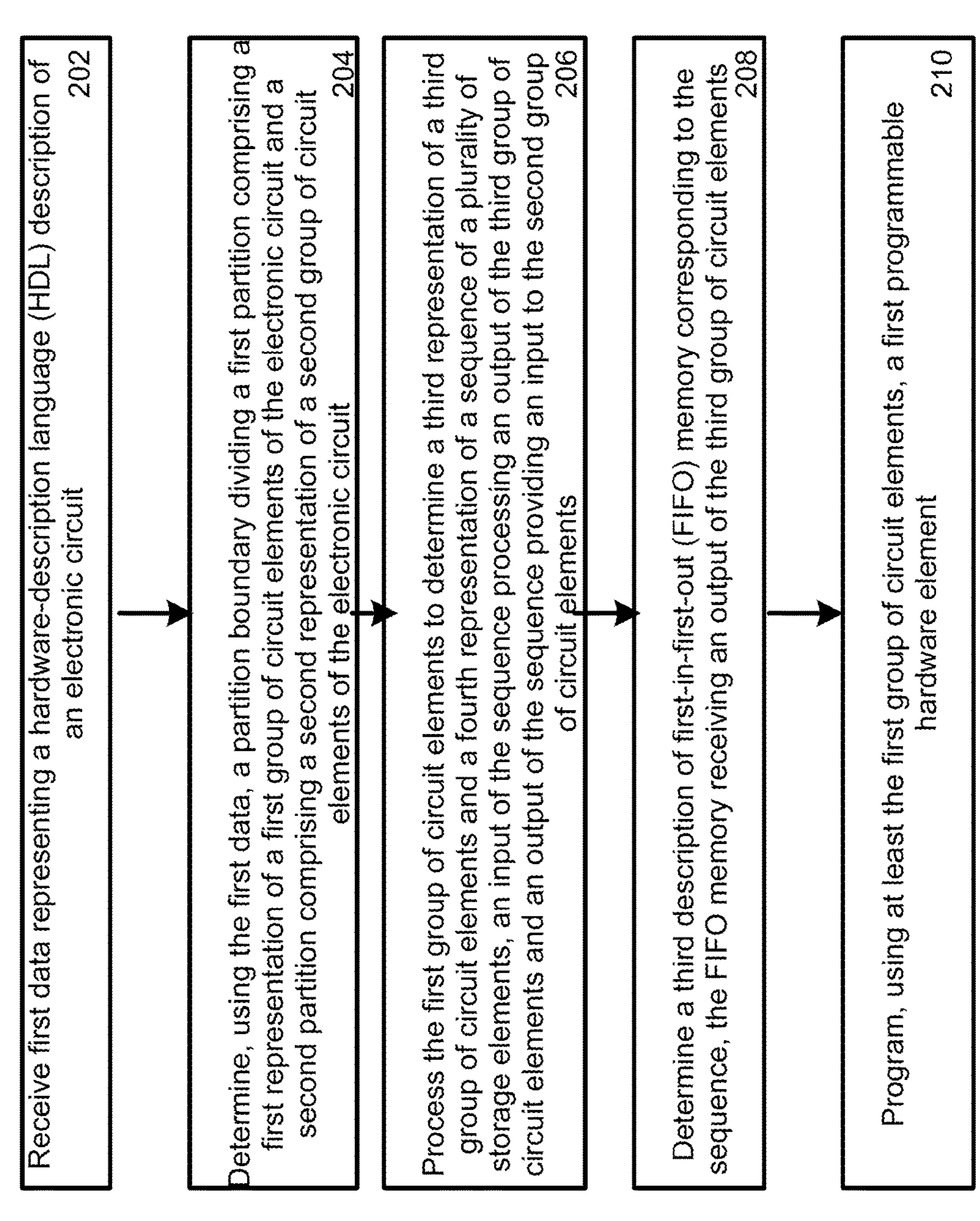
FIG. 2A
Receive first data representing a hardware-description language (HDL) description of an electronic circuit
202
Determine, using the first data, a partition boundary dividing a first partition comprising a first representation of a first group of circuit elements of the electronic circuit and a second partition comprising a second representation of a second group of circuit elements of the electronic circuit
204
Process the first group of circuit elements to determine a third representation of a third group of circuit elements and a fourth representation of a sequence of a plurality of storage elements, an input of the sequence processing an output of the third group of circuit elements and an output of the sequence providing an input to the second group of circuit elements
206
Determine a third description of first-in-first-out (FIFO) memory corresponding to the sequence, the FIFO memory receiving an output of the third group of circuit elements
208
Program, using at least the first group of circuit elements, a first programmable hardware element
210

Program, using at least the third group of circuit elements, a second programmable hardware element;
212
Store an output of the first programmable hardware element in the FIFO memory
214
Output, from the FIFO memory, an input to the second programmable hardware element.
216
Output, from the FIFO memory, an input to the second programmable hardware element.
218

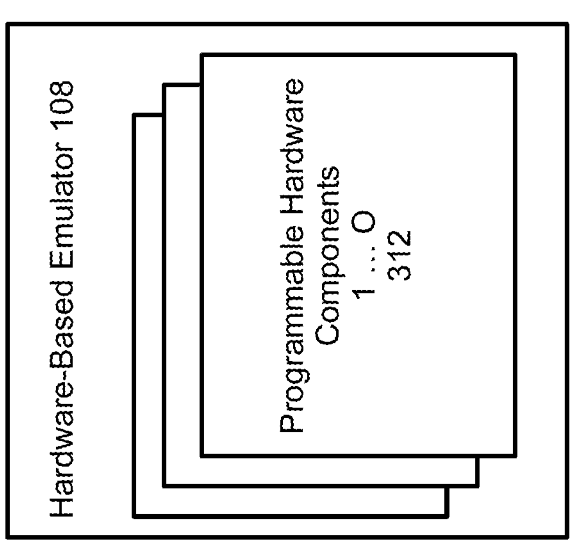
FIG. 3A
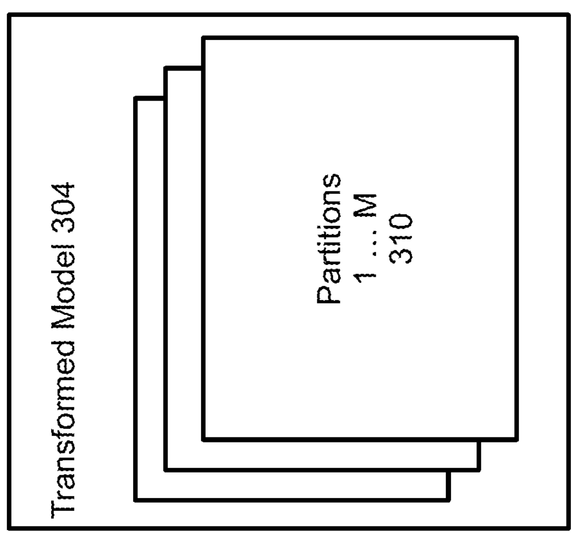
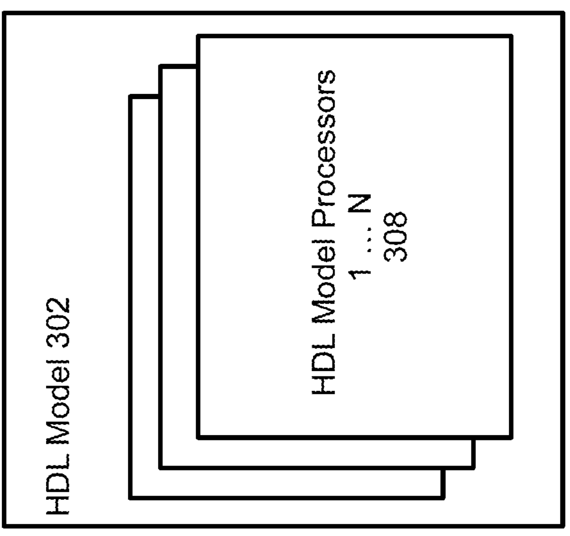

HDL Model 102
HDL Model Processor Element B 328
Partition C 324
HDL Model Processor Sub-Element B2 332
Partition Connection BC 336
Partition B 322
HDL Model Processor Sub-Element B1 330
Partition Connection AB 334
Partition A 320
HDL Model Processor Element A 326

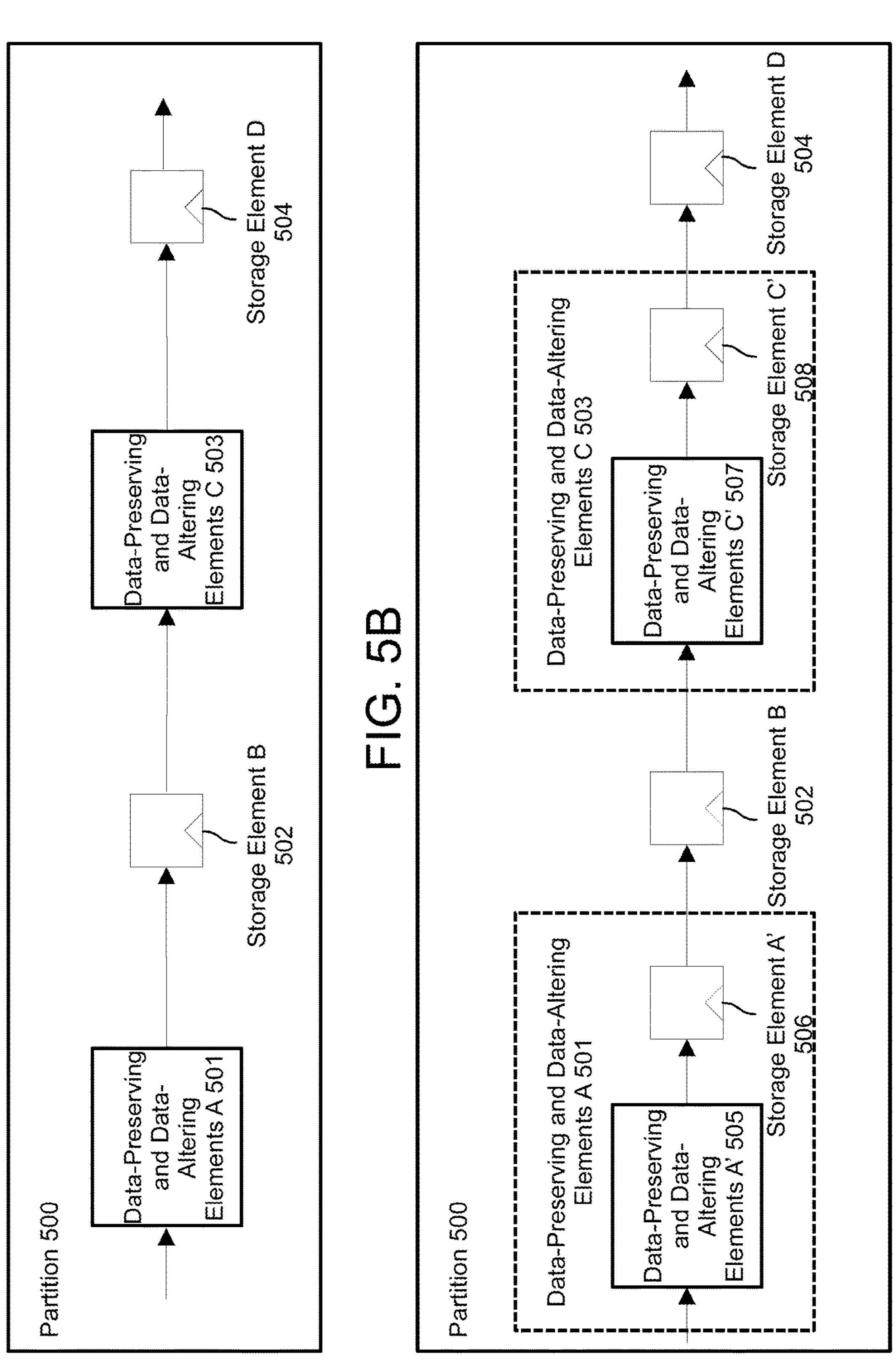
FIG. 5A
Partition 500
Data-Preserving and Data-Altering Elements A 501
Storage Element B 502
Data-Preserving and Data-Altering Elements C 503
Storage Element D 504
FIG. 5B
Partition 500
Data-Preserving and Data-Altering Elements A 501
Data-Preserving and Data-Altering Elements A' 505
Storage Element A' 506
Storage Element B 502
Data-Preserving and Data-Altering Elements C 503
Data-Preserving and Data-Altering Elements C' 507
Storage Element C' 508
Storage Element D 504

Partition 510
Partition Output 511
Partition 500
Data-Preserving and Data-Altering Elements C' 507
Storage Element A' 506
Storage Element B 502
Storage Element C' 508
Storage Element D 504

FIG. 6A

Data-Altering Elements 602

Data-Preserving Elements 604

Data-Preserving Elements 606

Data-Altering Elements 608

FIG. 6B

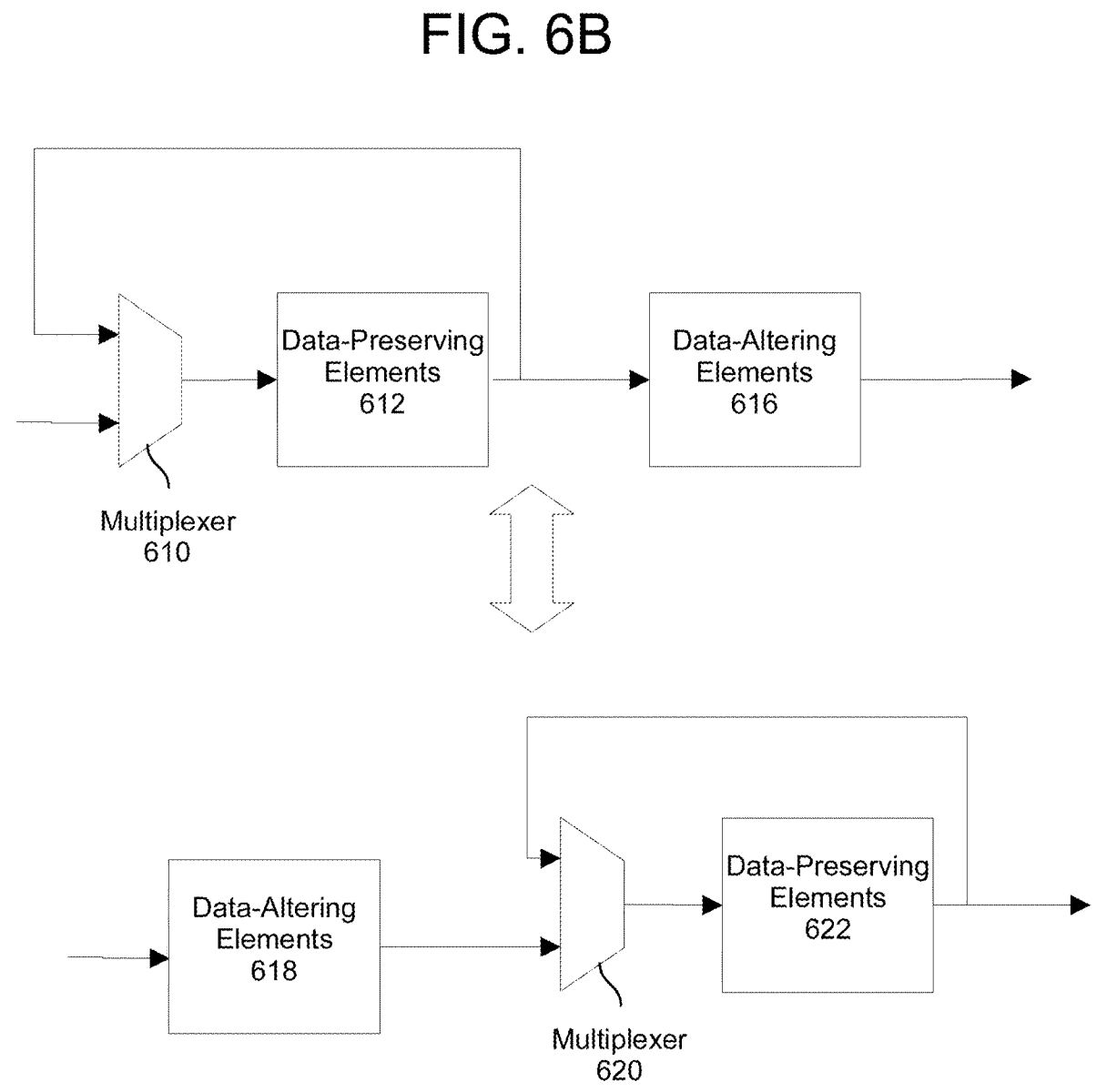

Data-Altering Elements 616

Data-Preserving Elements 612

Multiplexer 610

Data-Preserving Elements 622

Multiplexer 620

Data-Altering Elements 618

FIG. 6C

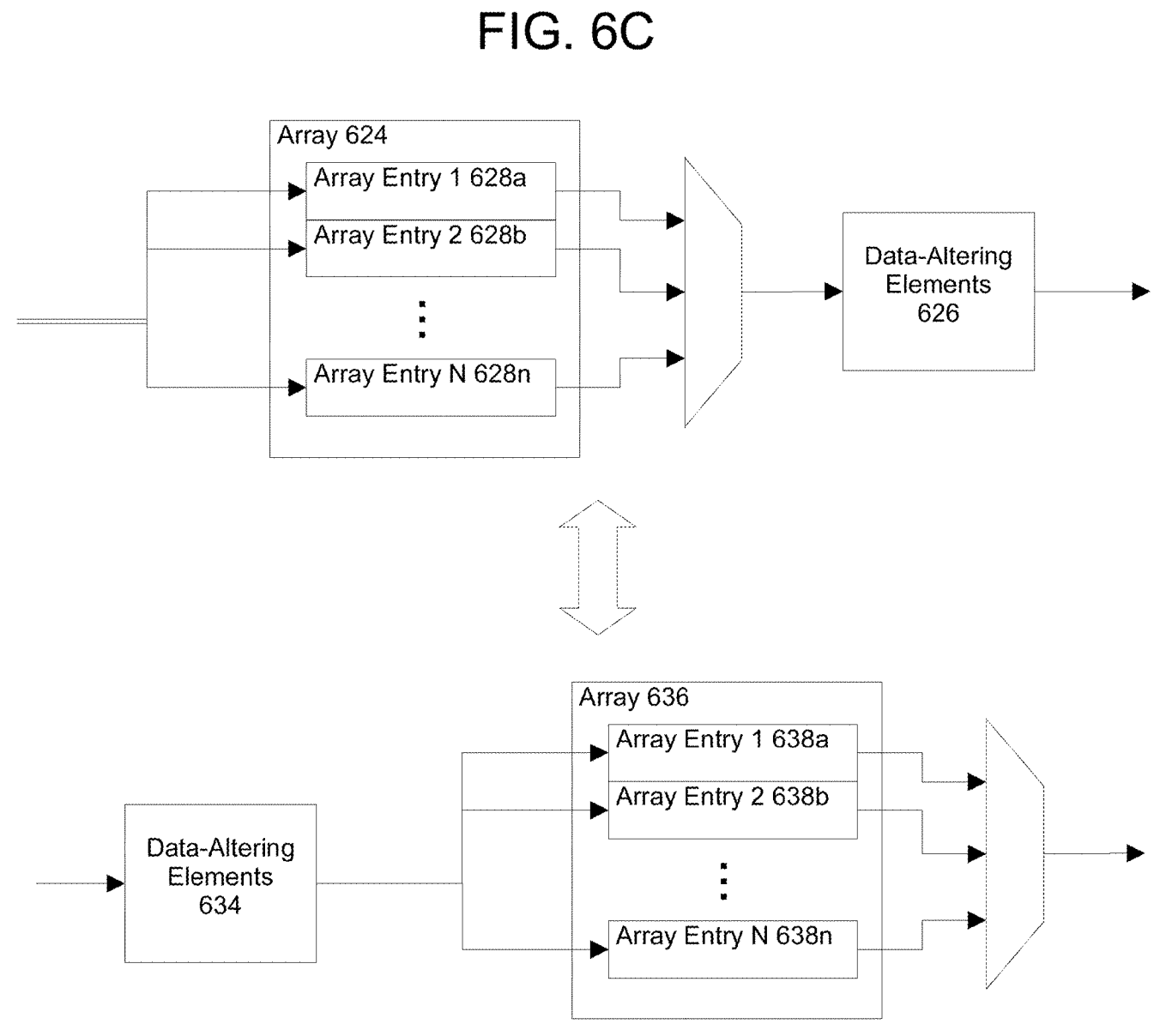

Array 624
Array Entry 1 628a
Array Entry 2 628b
...
Array Entry N 628n

Data-Altering Elements 626

Data-Altering Elements 634

Array 636
Array Entry 1 638a
Array Entry 2 638b
...
Array Entry N 638n

FIG. 6D

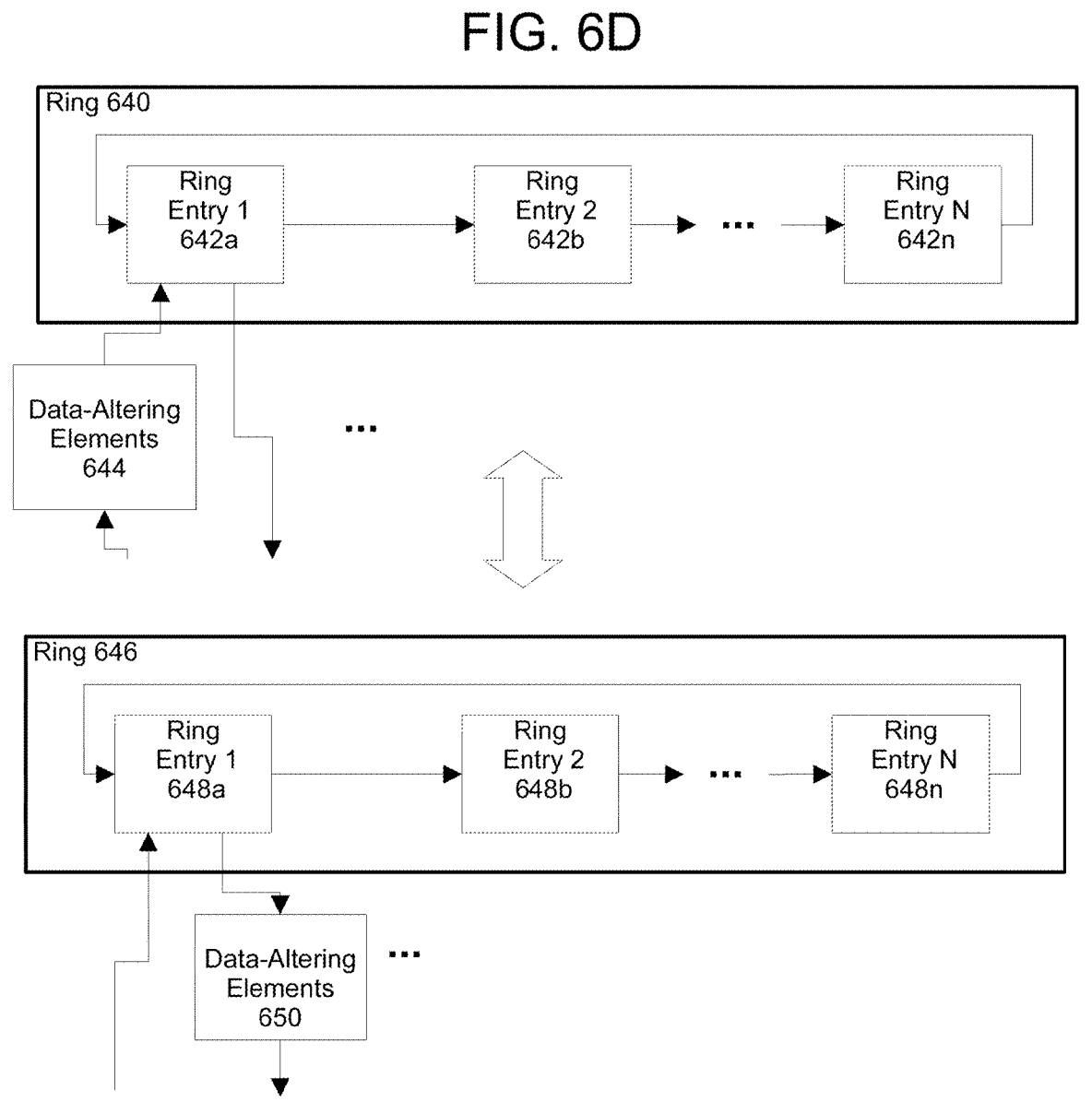

Ring 640

Ring Entry 1 642a

Ring Entry 2 642b

...

Ring Entry N 642n

Data-Altering Elements 644

...

Ring 646

Ring Entry 1 648a

Ring Entry 2 648b

...

Ring Entry N 648n

Data-Altering Elements 650

Figure 6E:
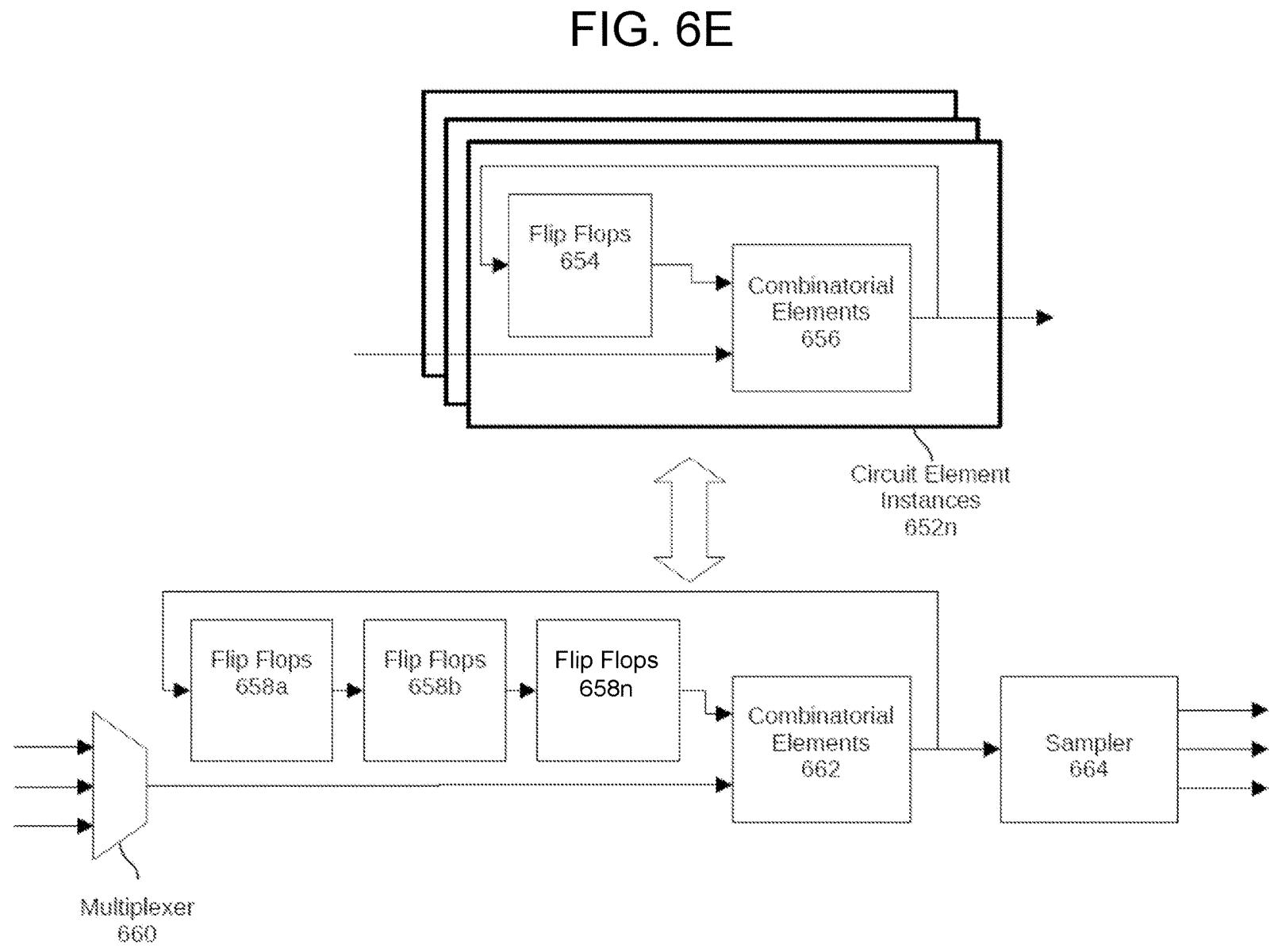

Flip Flops
654

Combinatorial
Elements
656

Circuit Element
Instances
652n

Flip Flops
658a

Flip Flops
658b

Flip Flops
658n

Combinatorial
Elements
662

Sampler
664

Multiplexer
660

Storage Element 666a
Data-Altering Elements 668
Storage Element 666b
Data-Altering Elements 670
Storage Element 666c
Storage Element 672a
Storage Element 666a
Data-Altering Elements 674
Storage Element 672b
Storage Element 672c
Data-Altering Elements 676
Storage Element 666c

FIG. 6G

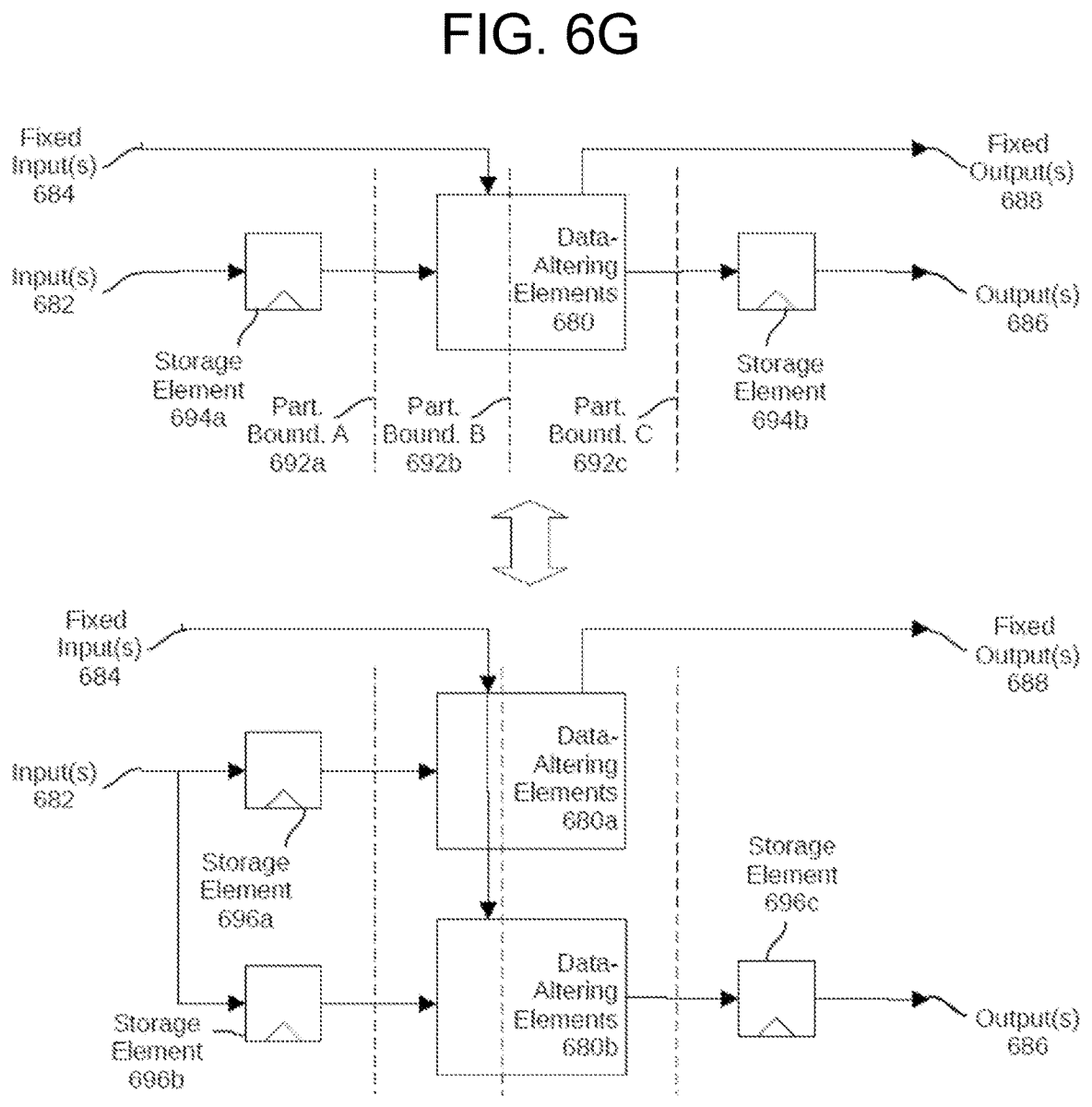

Fixed Input(s) 684
Input(s) 682
Storage Element 694a
Part. Bound. A 692a
Part. Bound. B 692b
Data-Altering Elements 680
Part. Bound. C 692c
Storage Element 694b
Fixed Output(s) 688
Output(s) 686

Fixed Input(s) 684
Input(s) 682
Storage Element 696a
Storage Element 696b
Data-Altering Elements 680a
Data-Altering Elements 680b
Storage Element 696c
Fixed Output(s) 688
Output(s) 686

Data-Preserving Elements 702
Data-Altering Elements 704
Data-Altering Elements 708
Data-Preserving Elements 706

Data-Preserving Elements 702
Data-Preserving Elements 706
Data-Altering Elements 704, 708

Input Data 722
Data Reference Determination Component 716
Data-Reference Storage Elements 712
Reference Data 718
Dense Data Storage Elements 714
Delayed Input Data 724
Data-Altering Elements 704, 708
Output Data 726

FIG. 8A

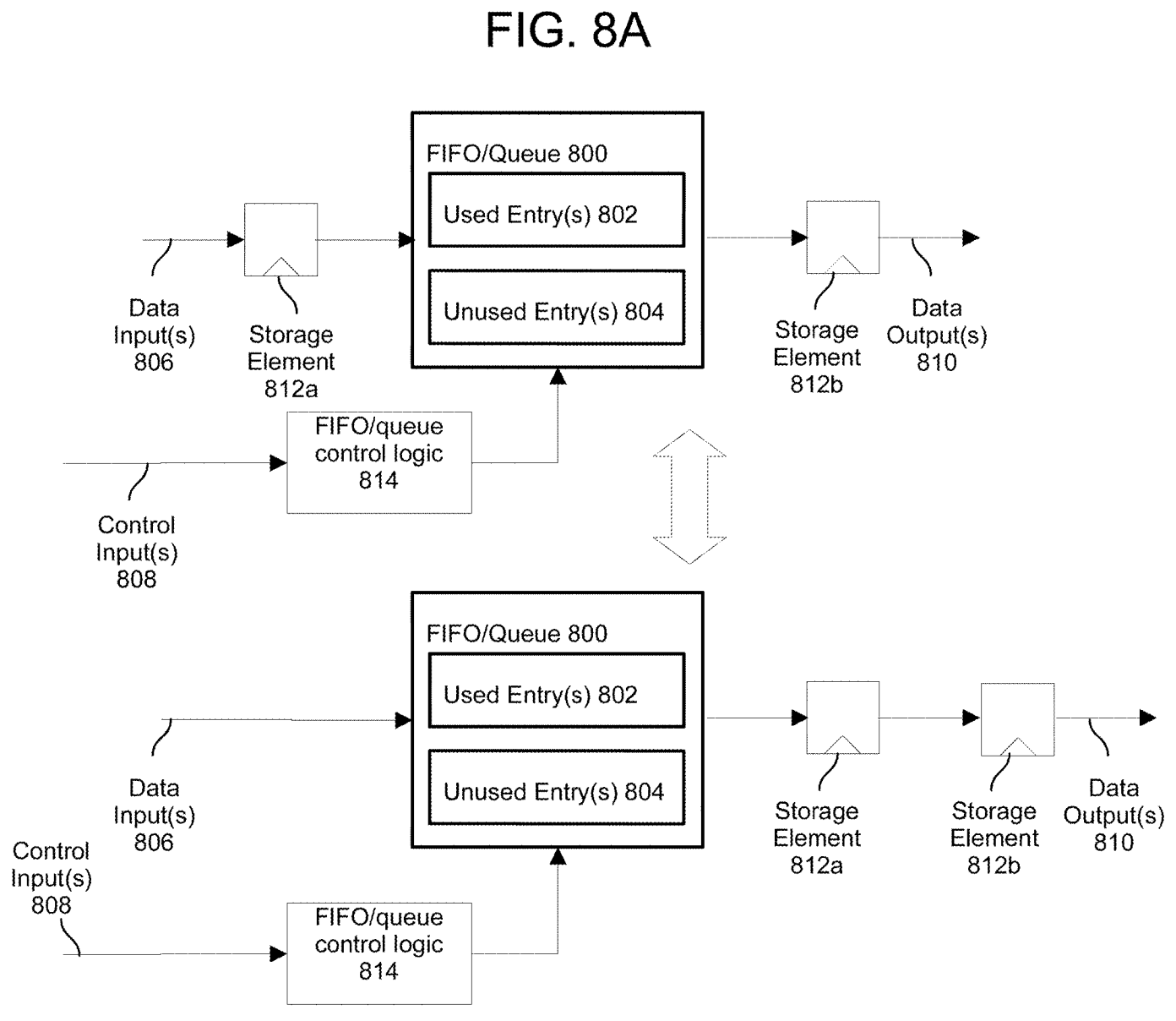

Data Input(s) 806

Storage Element 812a

FIFO/queue control logic 814

Control Input(s) 808

FIFO/Queue 800

Used Entry(s) 802

Unused Entry(s) 804

Storage Element 812b

Data Output(s) 810

Data Input(s) 806

Control Input(s) 808

FIFO/queue control logic 814

FIFO/Queue 800

Used Entry(s) 802

Unused Entry(s) 804

Storage Element 812a

Storage Element 812b

Data Output(s) 810

FIG. 9A

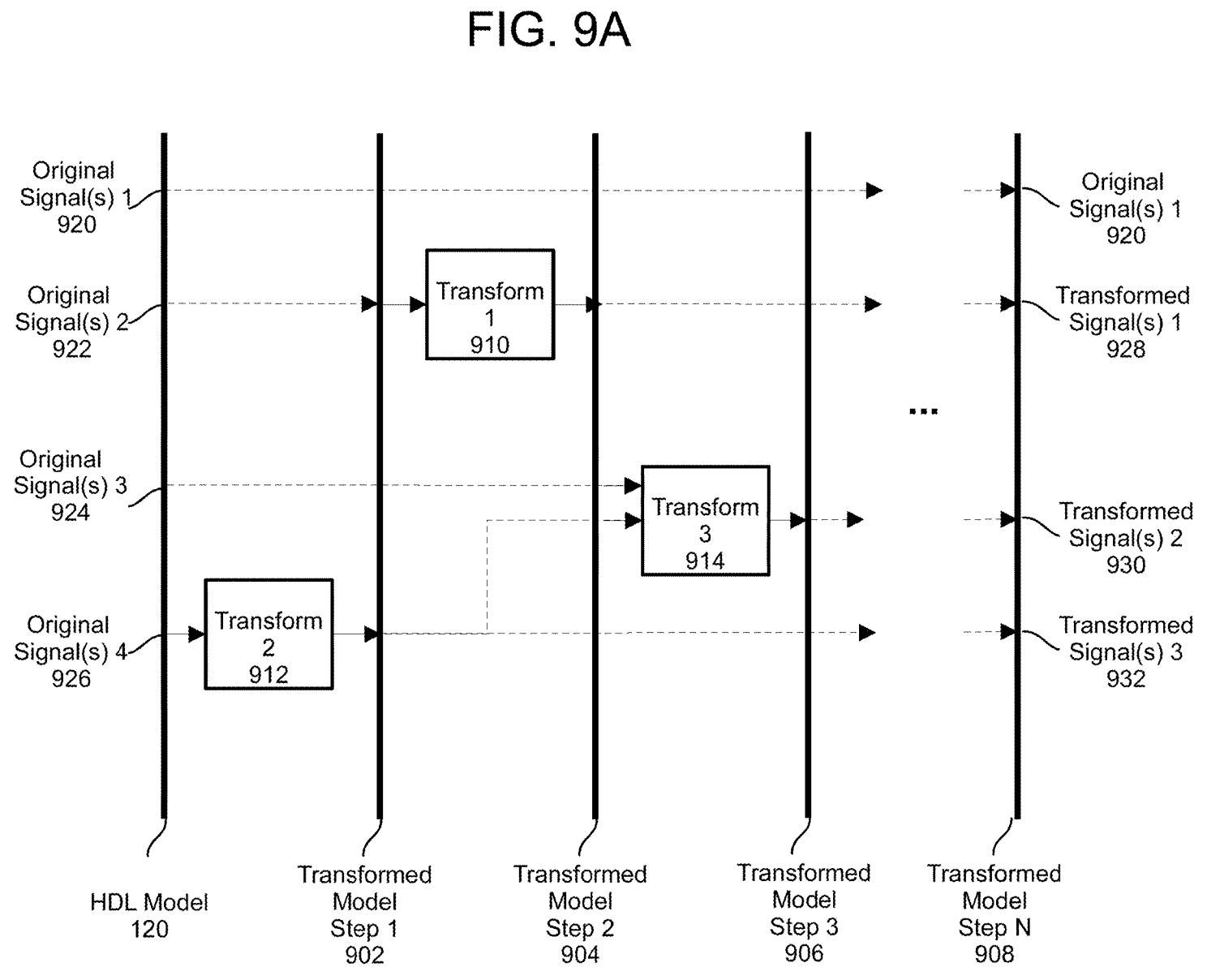

Original Signal(s) 1 920
Original Signal(s) 2 922
Original Signal(s) 3 924
Original Signal(s) 4 926
HDL Model 120
Transform 2 912
Transformed Model Step 1 902
Transform 1 910
Transformed Model Step 2 904
Transform 3 914
Transformed Model Step 3 906
...
Transformed Model Step N 908
Original Signal(s) 1 920
Transformed Signal(s) 1 928
Transformed Signal(s) 2 930
Transformed Signal(s) 3 932

Original Signal(s) 1 920
Transformed Signal(s) 1 928
Transformed Signal(s) 2 930
Transformed Signal(s) 3 932
Transformed HDL Model 122
Transform 3 914
Transform 1 910
Transform 2 912
Original Signal(s) 1 920
Original Signal(s) 2 922
Original Signal(s) 3 924
Original Signal(s) 4 926
HDL Model 120

User Device 110
Bus 1010
Network(s) 100
I/O Device Interfaces 1002
Controller(s) / Processor(s) 1004
Memory 1006
Storage 1008
Antenna 1012
Microphone(s) 1014
Speaker 1016
Display 1018

Remote System(s) 1110
Bus
1110
I/O Device
Interfaces
1102
Controller(s) /
Processor(s)
1104
Memory
1106
Storage
1108
Network(s)
100

FIG. 12

Tablet Computer 110c

Desktop Computer 110b

Network 100

Smart Phone 110d

Remote System(s) 1100

Laptop Computer 110a

SYSTEM AND METHOD FOR ELECTRONIC CIRCUIT EMULATION

CROSS-REFERENCE TO RELATED APPLICATIONS

This application claims priority to and the benefit of, and incorporates by reference herein in their entirety, U.S. Provisional Patent Application Ser. Nos. 63/235,287 and 63/235,283, both filed Aug. 20, 2021, in the name of Steven F. Hoover.

BACKGROUND

A design of an electronic circuit, such as a microprocessor, application-specific integrated circuit (ASIC), or any other such circuit, may be designed by first describing it using a hardware-description language (HDL), such as the Very-High-Speed Hardware-Description Language (VHDL). The HDL description may be verified for correct operation by using it to create a corresponding emulation of the electronic circuit; this emulation may be wholly or partially implemented using programmable computer hardware, such as one or more field-programmable gate arrays (FPGAs). The emulation may be tested by applying patterns of signals to inputs of all or part of the programmable computer hardware and by observing its corresponding output signals.

BRIEF DESCRIPTION OF DRAWINGS

For a more complete understanding of the present disclosure, reference is now made to the following description taken in conjunction with the accompanying drawings.

FIGS. 2A and 2B illustrate a method for verifying operation of a transformed HDL model according to embodiments of the present disclosure.

FIGS. 3A and 3B illustrate components used for hardware-based emulation according to embodiments of the present disclosure.

FIGS. 5A-5E illustrate systems and methods for creating sequence of storage elements according to embodiments of the present disclosure.

FIGS. 6A-6G illustrate techniques for transforming circuit elements according to embodiments of the present disclosure.

FIGS. 8A-8C illustrate systems and methods for absorbing storage elements into larger storage elements according to embodiments of the present disclosure.

FIGS. 9A-9B illustrate systems and methods for remapping transformed signals according to embodiments of the present disclosure.

FIGS. 10, 11, and 12 illustrate computers and networks for emulating an HDL model of an electronic circuit according to embodiments of the present disclosure.

DETAILED DESCRIPTION

Figure 1A:
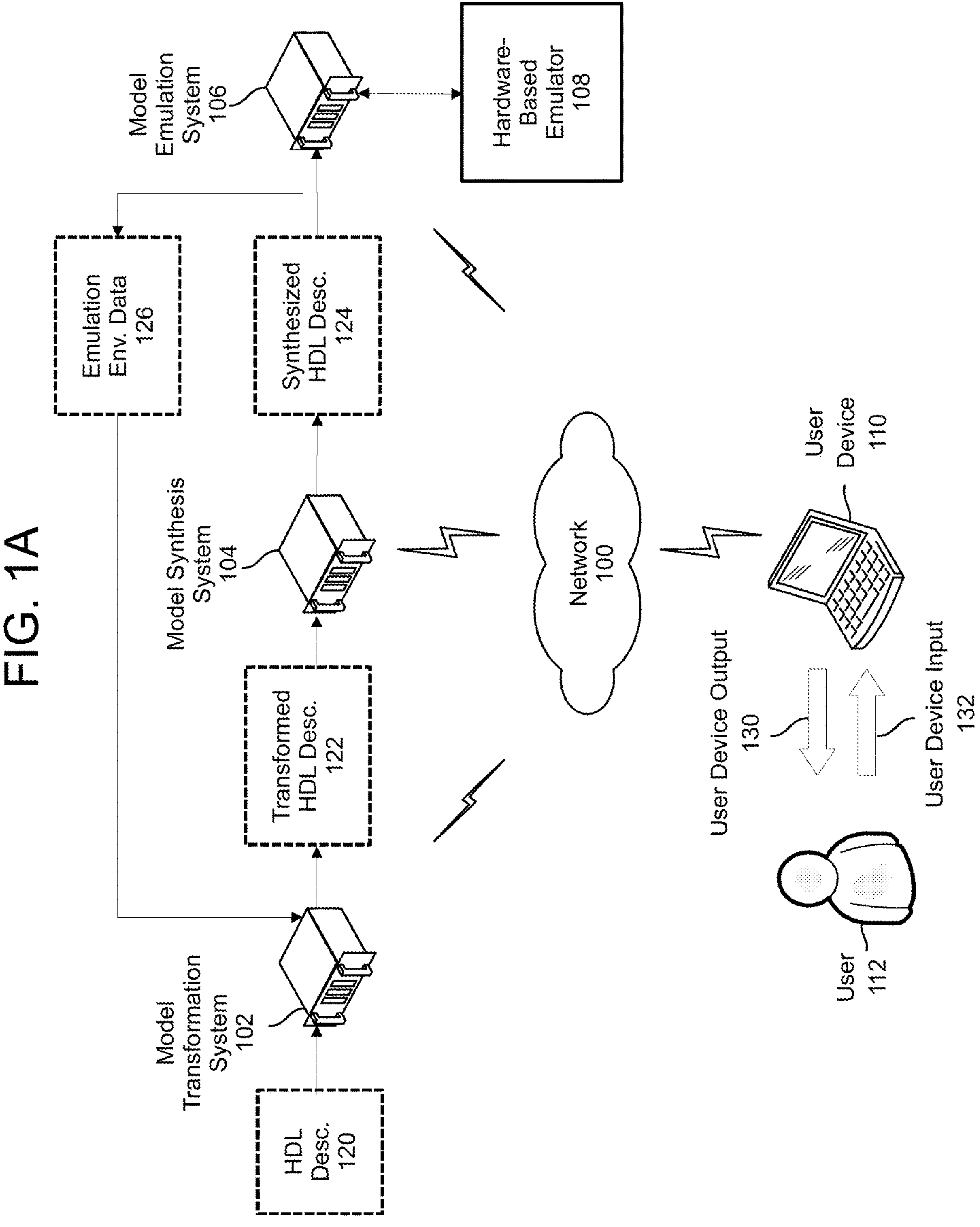
FIGS. 1A-1C illustrate an exemplary system for verifying operation of transformed HDL model of an electronic circuit using a hardware-based emulator according to embodiments of the present disclosure

The present disclosure relates to hardware-based emulation of a hardware-description language (HDL) model of an electronic circuit, such as a microprocessor, application-specific integrated circuit (ASIC), or any other such circuit, using programmable (i.e., reconfigurable) computer hardware, such as one or more field-programmable gate arrays (FPGAs). In particular, the present disclosure relates to using one or more of the techniques described herein to (a) increase the speed of the emulation of the HDL model, (b) reduce the amount of circuit elements (i.e., digital-logic circuitry) required to model the behavior of the HDL model, and/or (c) reduce the area required to implement the HDL model using the programmable computer hardware. For example, use of one or more of the techniques described herein may determine a transformed HDL model for programming the one or more FPGAs required to simulate the electronic circuit, thereby increasing the speed and/or reducing the cost, complexity, size, required power, and/or build time of the emulation system. The resultant emulation system may be tested by applying patterns of signals to inputs of all or part of the programmable computer hardware and by observing some or all corresponding output signals.

In various embodiments of the present disclosure, one or more of the circuit-element transformation techniques described herein (as described in greater detail below with reference to, for example, FIGS. 6A-6G) may be applied by a model-transformation system to the HDL description to create one or more sequences of storage elements, such as flip-flops. As the term is used herein, a sequence includes two or more storage elements, such as flip-flops, configured such that an output of a first storage element connects to an input of a second storage element, an output of the second storage element connects to an input of a third storage element, and so on. Data received by the input of the sequence of storage elements may be thus the same as the output of the sequence of storage elements; the output is a time-delayed version of the input as determined by one or more control signals, such as a clock signal received by the flip-flops. The model-transformation system may create one or more of these sequences of storage elements such that they cross a boundary between a first group of circuit elements (referred to herein as a partition) and a second group of circuit elements or partition. The first partition determines the input to the sequence of storage elements; this partition may be referred to as the upstream partition. The second partition receives the output to the sequence of storage elements; this partition may be referred to as the downstream partition. As described in greater detail below (by, for example, FIGS. 5D and 5E), the downstream partition may access data stored in some or all of the storage elements of the sequence of storage elements by, for example, storing the contents of the sequence of storage elements in a FIFO. This FIFO may allow the downstream partition to continue processing data to account for a latency between FPGA elements and/or even if the upstream partition is temporarily unable to produce further output data (i.e., a "stall") and thus allow the overall system to run the emulation more quickly.

Referring first to FIG. 1A, a model-transformation system 102 may process an HDL description 120 (which describes an electronic circuit to be tested in the HDL) to determine a transformed HDL description 122. As described in greater detail herein, the model-transformation system 102 may process the HDL description 120 to determine that one or more groups of circuit elements are able to be transformed (e.g., migrated and/or retimed) as described herein to thereby improve the speed and/or reduce the area of the hardware-based emulator 108. The transformed HDL description 122 may describe the electronic circuit in the same or different computing language as used by the HDL description 120. The transformed HDL description 122 may include a portion of the HDL description 120 that has not been so transformed; the transformed HDL description 122 may omit other portions of the HDL description 120 that have been transformed as well as a description of any transformed circuit elements.

A model-synthesis system 104 may process the transformed HDL description 122 to determine a synthesized HDL description 124. While the HDL description 120 may contain (for example) Boolean logic equations and similar statements, the synthesized HDL description 124 may contain corresponding representations of circuit elements (e.g., AND and OR gates that implement a Boolean logic equation). The model-synthesis system 104 may perform basic logic optimization (e.g., combining or merging circuit elements when possible) and/or simple retiming (e.g., reconfiguring circuit elements to solve a critical-path or race condition). Examples of model-synthesis systems include the STRATUS and GENUS systems provided by Cadence Design Systems of San Jose, CA, USA. One of skill in the art will understand that any model-synthesis system is within the scope of the present disclosure.

A model-emulation system 106 may process the synthesized HDL description 124 to program one or more programmable hardware components 162 (e.g., FPGAs) of a hardware-based emulator 108. The hardware-based emulator 108 may further contain software component(s) 160 for providing inputs to, and processing outputs from, the one or more programmable hardware components 162*a*-162N. The hardware-based emulator 108 is described in more detail with reference to FIG. 1C.

The model-transformation system 102, the model-synthesis system 104, and the model-emulation system 106 may communicate with each other and/or a user device 110 via a network 100; this network 100 may be a wired, wireless, or any other type of network. A user 112 may provide input 132 to the user device 110 to initiate transformation of the HDL description 120 by the model-transformation system 102, to initiate synthesis of the transformed HDL description 122 by the model-synthesis system 104, and/or initiate programming and/or execution of the synthesized HDL model 124 by the model-emulation system. The user 112 may further receive output 130 from the user device 110 indicating feedback from the systems 102, 104, 106. The user 112 may further interact with the model-emulation system 106 via the user-device input 132 and the user-device output 130 to initialize emulation, execute emulation, and/or view the results of an emulation.

Figure 11:
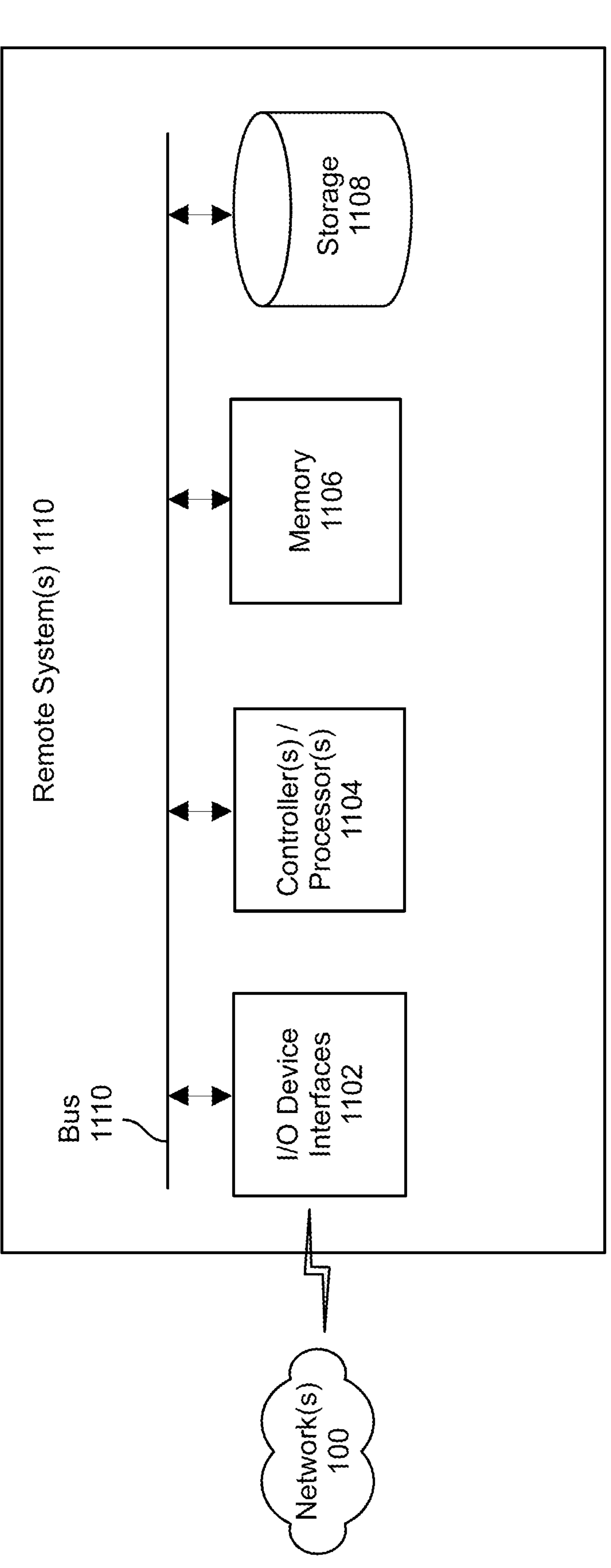

Any number of user devices 110 and users 112 may so communicate with the systems 102, 104, 106. The systems 102, 104, 106 may be disposed on one or more remote systems 1100, as shown in FIG. 11. Input data 132 may specify the behavior of input signals, such at which times a particular input signal is represented by a logical "0" or a logical "1." Operation of the emulator 108 includes applying the specified input signals to one or more elements of the emulator, determining the outputs of those elements, and similar processing of those outputs by additional elements. The output data of the computer model may be displayed on a display of the user device 110 and/or stored in computer data, such as a text data file and/or trace data file. The emulator 108 may be interactive, and may simulate only portions of the model derived from the synthesized HDL description 124 and/or only certain periods of time of operation of the model per user (and/or other) control input.

Waveform viewers of the user device 110 may be used to represent model output data, such as signal traces, as signal waveforms. Waveform viewers may be categorized as timeline views, where time is represented on one of the two axes of the two-dimensional display, and the state of the model is represented on the other axis. A state view may be used to represent machine state at a point in time. State viewers may provide interactive controls to allow a user to adjust which period of time is displayed. In synchronous logic, controlled by a clock, time may be expressed discretely as clock cycles. Timeline views and state views are not a mutually exclusive categorization. More generally, state views may represent a window of time in the neighborhood of a reference time. A timeline view with a reference time, such as a waveform view with a cursor (vertical line at the reference time), can also be considered a state view.

The outputs of the emulator 108 may further be used to represent emulation behavior as a state view by, for example, annotating displayed wires/arcs with values from the emulation. Unlike waveform viewers, these representations may require knowledge of the emulation, not just the signal trace.

In some embodiments, the model-transformation system 102 receives emulation-environment data 126 from the model-emulation system 106. This data 126 may include indications of the number and types of programmable hardware components available in the hardware-based emulator 108, in addition to latencies that exist therebetween. As explained in greater detail below, the emulation-environment data 126 may be used to determine partition boundaries in the transformed HDL description 122. By determining partition boundaries that correspond to the hardware-emulator latencies, the overall cycle time of the emulator may be increased.

Figure 1B:
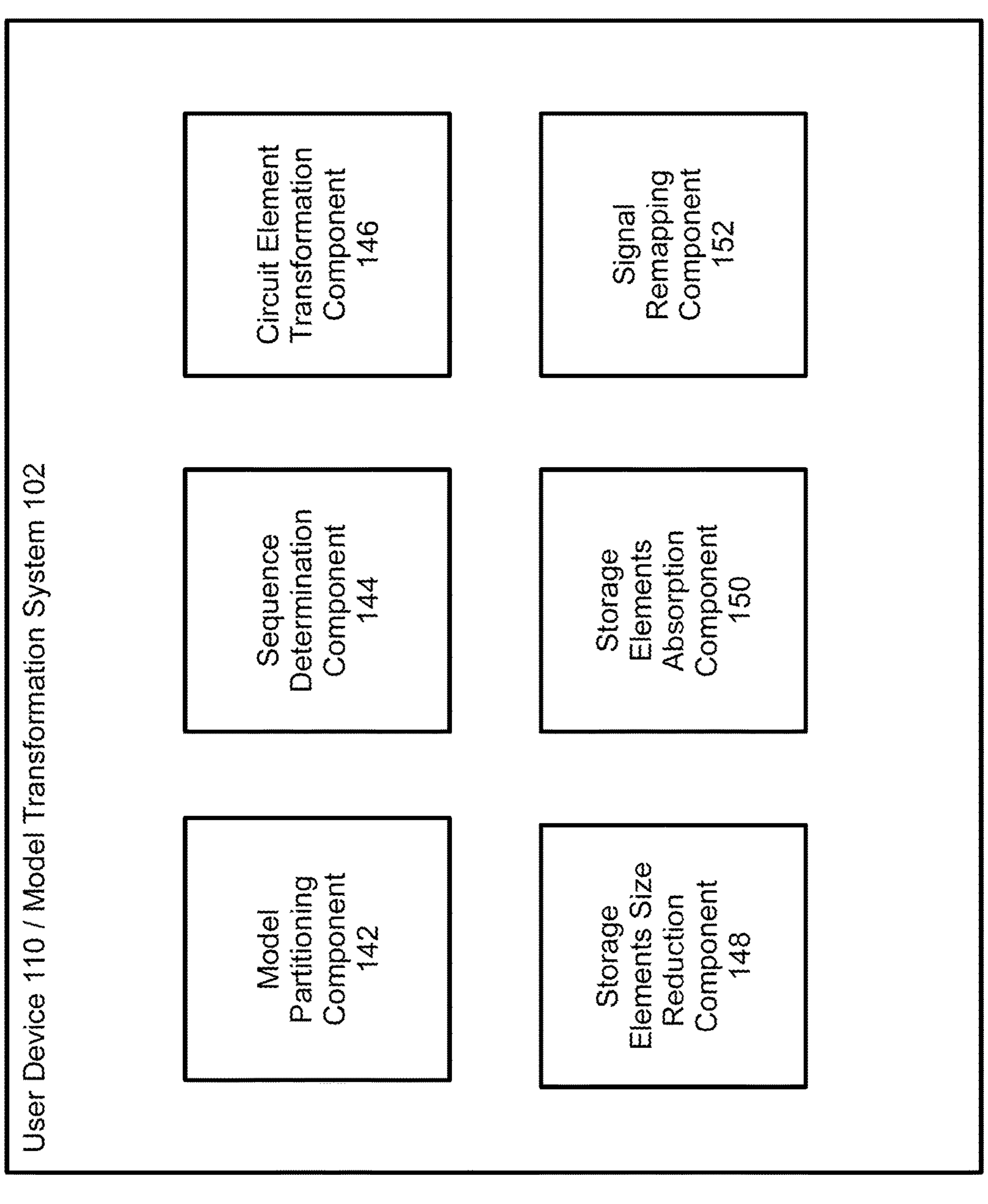
Figure 1C:
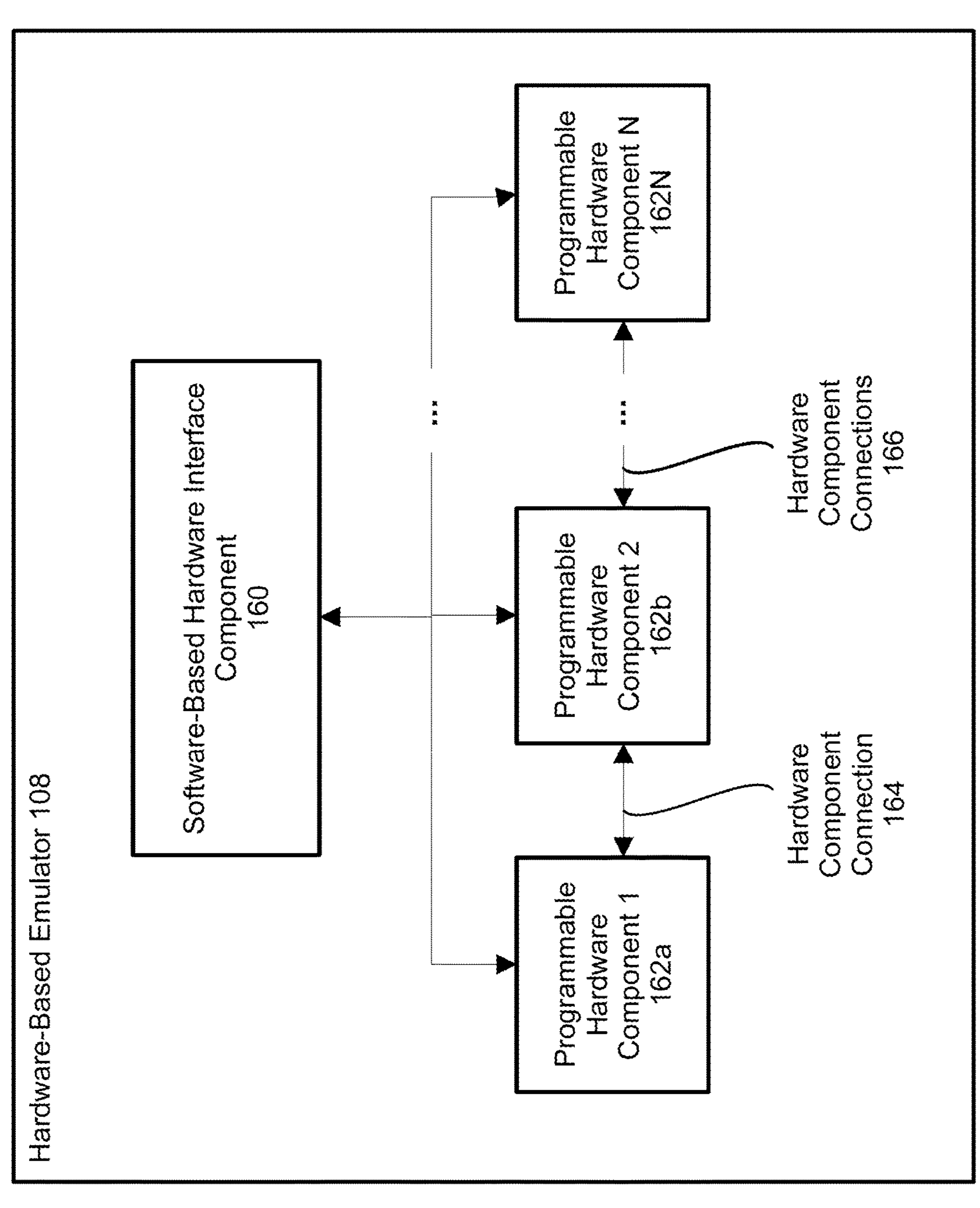
Figure 10:
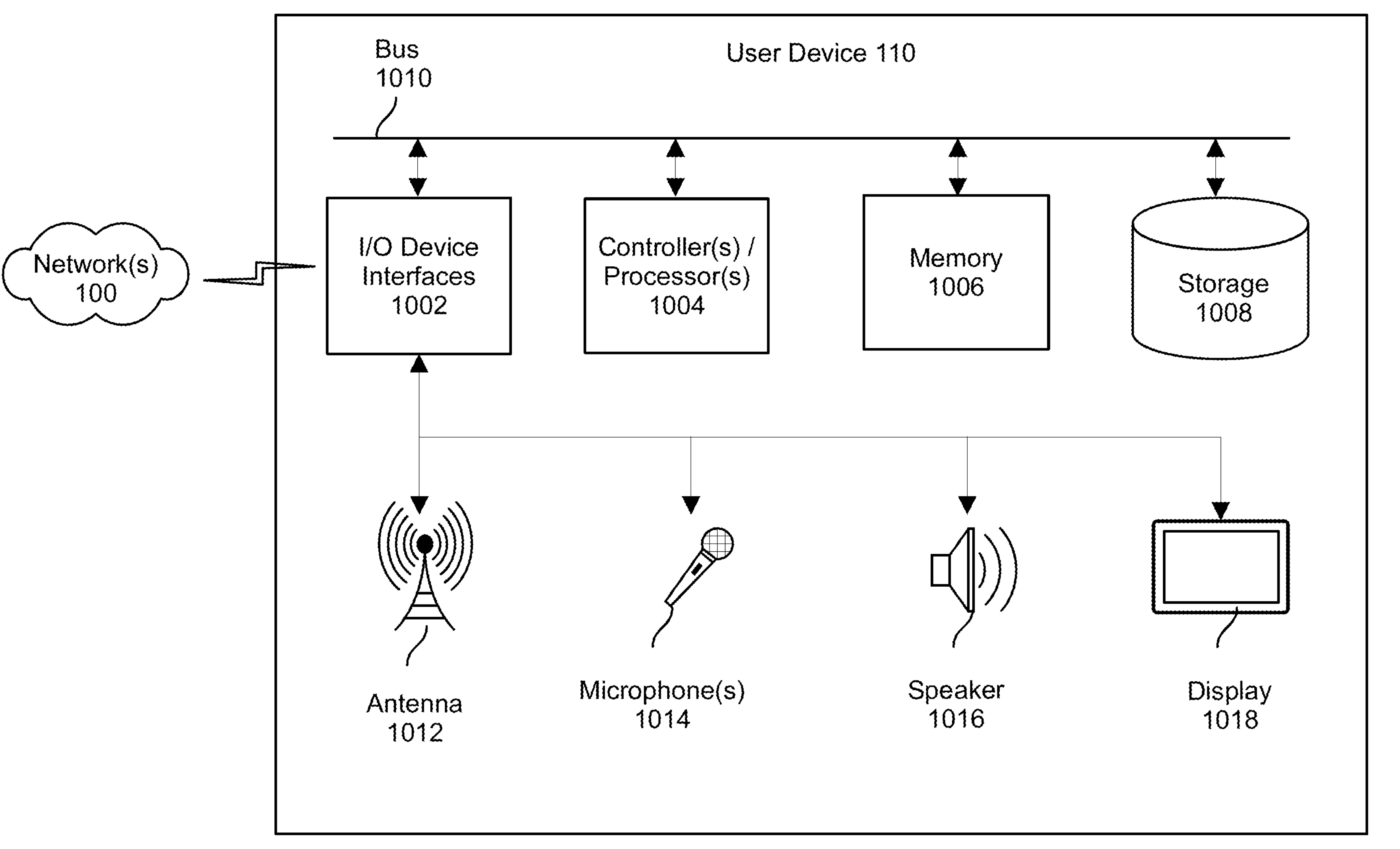

FIG. 1B illustrates a number of software components of the model-transformation system 102 relevant to the present disclosure. Some or all of the components may instead or in addition be disposed on the user device 110. Other components of the user device 110 and model-transformation system 102 are illustrated in FIGS. 10 and 11; one of skill in the art will understand that the user device 110 and model-transformation system 102 may contain still other components.

A model-partitioning component 142 may parse the HDL description 120 to determine two or more partitions, each with corresponding partition boundaries and associated groups of circuit elements. As described in greater detail below with respect to FIG. 3B, the model-partitioning component 142 may select partitions and boundaries such that a sequence of storage elements (e.g., sequence of flip-flops) may span the partition boundary and allow a partition downstream of the sequence of storage elements to use the data stored in the flip-flops (and/or a FIFO derived therefrom). This access to the sequence may enable the downstream partition to continue to process data even if an inter-FPGA latency is associated with the partition boundary and/or if the partition upstream of the sequence of storage elements stalls due to, e.g., an unmet data dependency or other such dependency (collectively referred to as "backpressure"). In some embodiments, the model-partitioning component 142 determines partition boundaries to correspond to inter-FPGA latencies as defined by the emulation environment data 126. Further details of partition boundaries and selection thereof are discussed in further detail with respect to FIG. 3B.

A sequence-of-storage-elements determination component 144 may parse the HDL description 120 to identify groups of circuit elements that correspond to one or more circuit-element transformations (candidate transformations are explained in greater detail with respect to FIGS. 6A-6G). The sequence-of-storage-elements determination component 144 may then select and perform one or more transformations to create one or more sequences of storage elements (e.g., sequences of flip-flops) that span or abut one or more partition boundaries. Further details of the sequence-of-storage-elements determination component 144 are described in greater detail below with respect to FIGS. 5A-5E.

A circuit-element transformation component 146 may apply one or more transformations as directed by the sequence-of-storage-elements determination component 144 and/or the storage-elements size-reduction component 148. Further details of the various transformations are described in greater detail below with respect to FIGS. 6A-6G.

The storage-element size-reduction component 148 may process the HDL description 120 to identify structures of storage elements, such as FIFOs and/or queues, and absorb (e.g., merge) stand-alone storage elements, such as flip-flops, into the FIFOs and/or queues. The storage-element size-reduction component 148 may further preform one or more transforms such that additional storage elements are electrically connected adjacent to the FIFOs and/or queues. Further details of the operation of the storage-element size-reduction component 148 are described in greater detail below with respect to FIGS. 7A-7D.

A storage-element absorption component 150 may perform the absorption of the stand-alone storage elements into the FIFOs and/or queues. Further details of the storage-element absorption component 150 are described in greater detail below with respect to FIGS. 8A-8C.

A signal-remapping component 152 may be used to map signals created by the model-transformation system 102 in the transformed HDL description 122 to signals in the original HDL description 120. The user 112 may, for example, provide input 132 to the user device 110 requesting a value of a signal in the HDL description 120 at a particular time. If that signal was transformed to use different circuit elements, the signal-remapping component 152 may recursively apply corresponding reverse transforms to derive the value of the signal of the HDL description 120 from the values of signals of the transformed HDL description 122. Further details of the signal-remapping component 152 are described in greater detail below with respect to FIGS. 9A-9B.

Figure 2B:
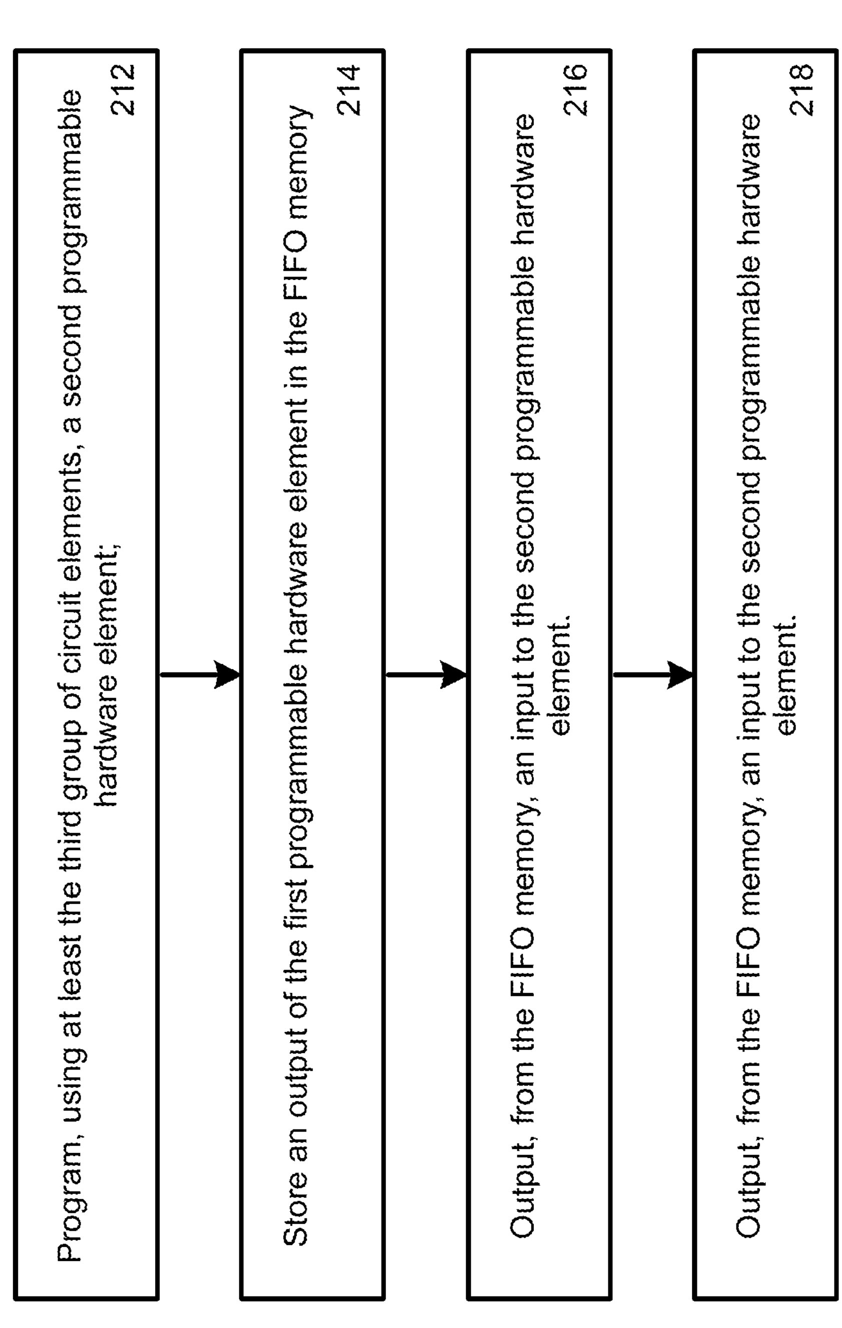

FIGS. 2A-2B illustrate methods of using circuit-element transformations in accordance with embodiments of the present disclosure.

Figure 3B:
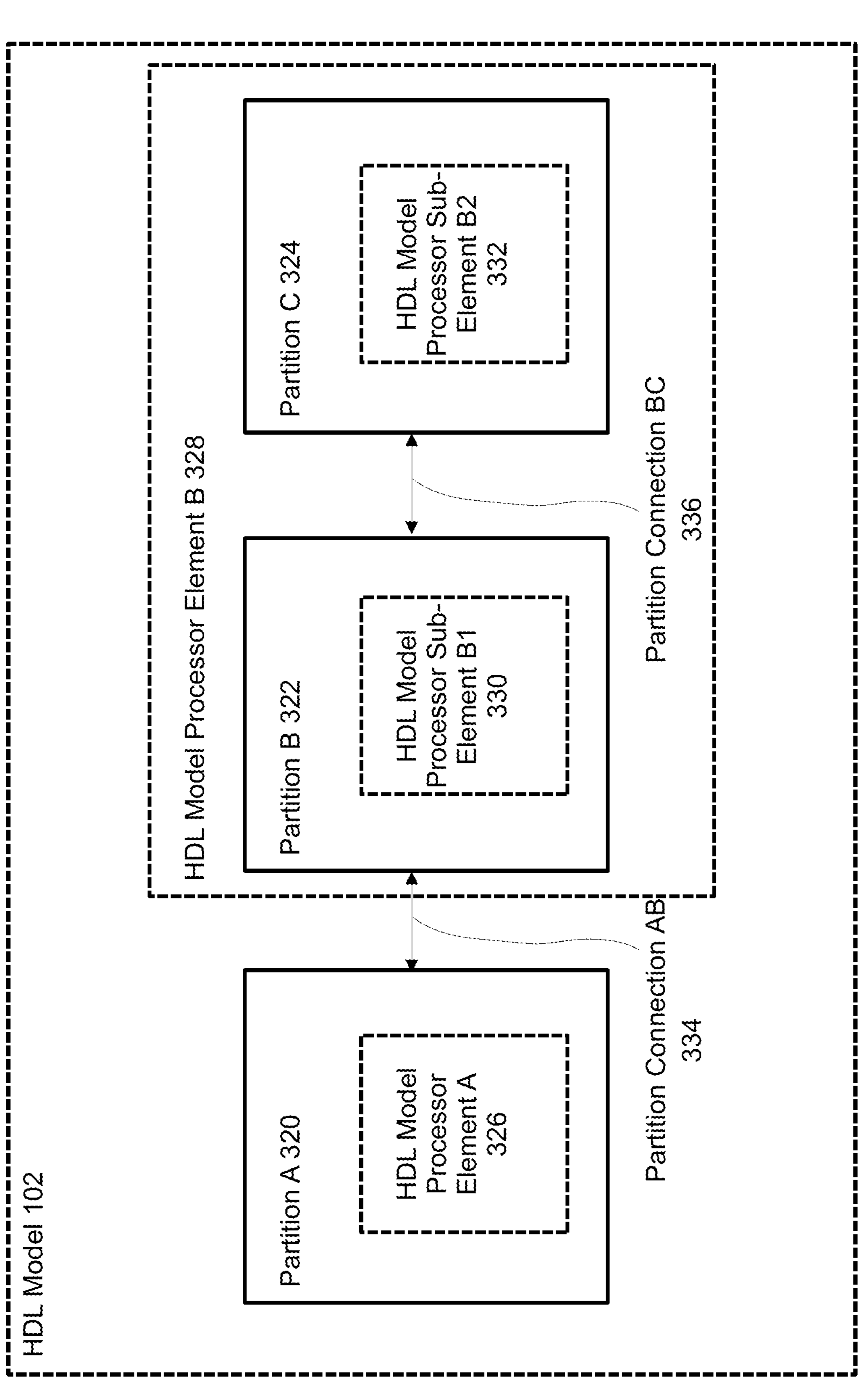

FIGS. 3A and 3B illustrate components used for hardware-based emulation according to embodiments of the present disclosure. Referring first to FIG. 3A, the HDL model 302 (created by processing the HDL description 120) may describe a hierarchical system in which the top level of hierarchy is a number N of processing units, each including the same or different circuit elements. The processing units may be computer processors 308 as described in the HDL description 120; the present disclosure is not limited, however, to only processors as the top-level hierarchical processing units, and any such units, such as processor cores, memories, caches, graphics processors, digital-signal processors, etc., are within the scope of the present disclosure. The processing units may be all the same (e.g., a 4×4 array of identical processors) or different (e.g., a first low-power processor and a second high-performance processor). In the target computing system (as distinguished from the emulator system) to be fabricated using the processing units, significant latencies may be incurred when a signal crosses a boundary between a first processing unit and a second processing unit. This delay may be much greater than a delay between a first circuit element and a second circuit element that exist on the same processing unit.

The transformed model 304 (created by processing the transformed HDL description 122), as described in greater detail herein, may be divided into two or more partitions 310 (by, for example, the model-partitioning component 142). The number of partitions may be M partitions and, in some embodiments, the number of partitions equals the number of processing units in the HDL model 302 and each partition corresponds to a processing unit (e.g., N=M). In other embodiments, as shown in FIG. 3B, a single processing unit may include two or more partitions. Each partition may contain a number of circuit elements.

The hardware-based emulator 108 may include a number O of programmable hardware components 312. As described herein, the programmable hardware components 312 may be field-programmable gated arrays (FPGAs) or any other type of programmable component. The programmable hardware components 312 may be disposed on a single system board, disposed on multiple system boards, or even disposed across multiple servers. As explained in greater detail below, the hardware-based emulator 108 may further include software components for enabling communication between the programmable hardware components 312 and the model-emulation system 106. The number O of programmable hardware components 312 may be the same or different from the number N of HDL model processors 308 and/or the number M of partitions 310.

FIG. 3B illustrates an example partition layout as determined by, for example, the model-partitioning component 142. A first partition A 320 may correspond to a first HDL model processor element A 326. A second HDL model processor element B 328 may include two partitions: partition B 322, corresponding to a first HDL model processor sub-element B1 330 and partition C 324, corresponding to a second HDL model processor sub-element 332. Any number of partitions corresponding to processor elements (or other such top-level hierarchical elements, as described above) and any number of partitions within a processor element (or other such top-level hierarchical element) is within the scope of the present disclosure.

A partition connection AB 334 may connect the partition A 320 and the partition B 322, and a partition connection BC 336 may connect the partition B 322 and the partition C 324. The connections 334, 336 may be direct (e.g., wired) connections between the partitions. In other embodiments, the connections 334, 336 incorporate some or all of the software-based hardware interface component 160. That is, the interface component 160 may receive the output of an upstream partition, process it, and provide a processed output to the downstream partition. In some embodiments, the interface component 160 models one or more storage elements (e.g., flip-flops) in hardware or software; these storage elements may correspond to, for example, the sequence of storage elements storage elements as described with reference to FIGS. 5A-5E.

Figure 4A:
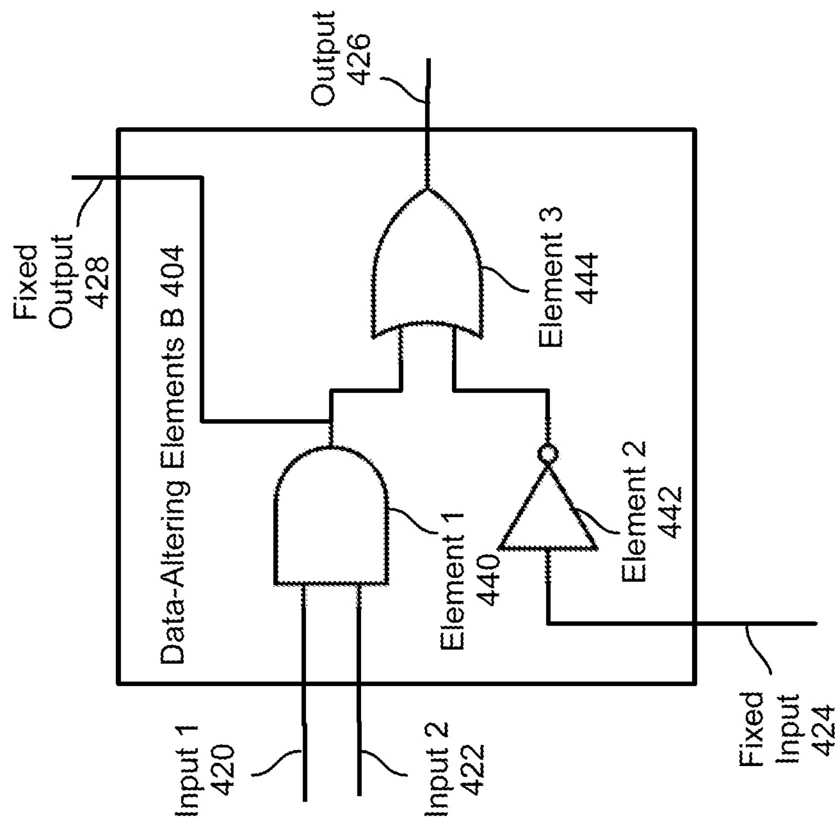
FIGS. 4A-4C illustrate electronic circuit elements used in hardware-based emulation according to embodiments of the present disclosure.
Figure 4A:
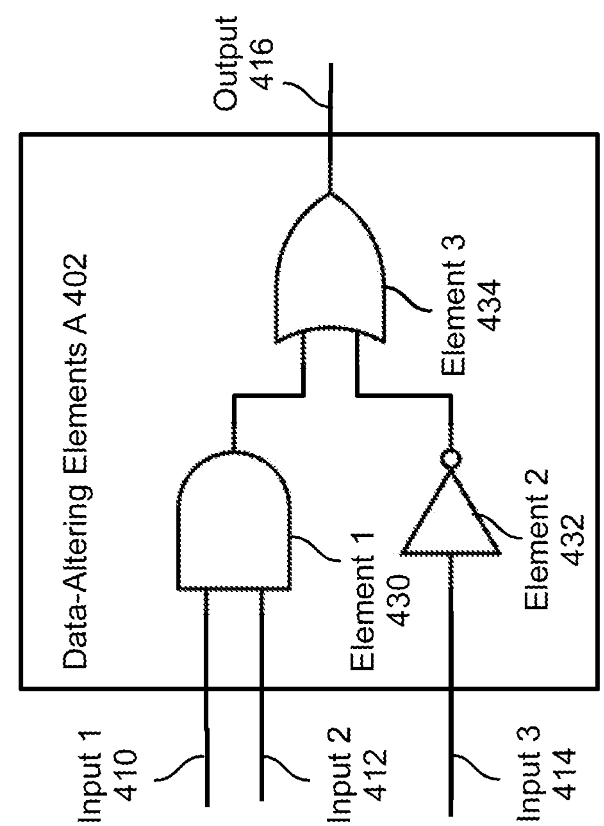
Figure 4B:
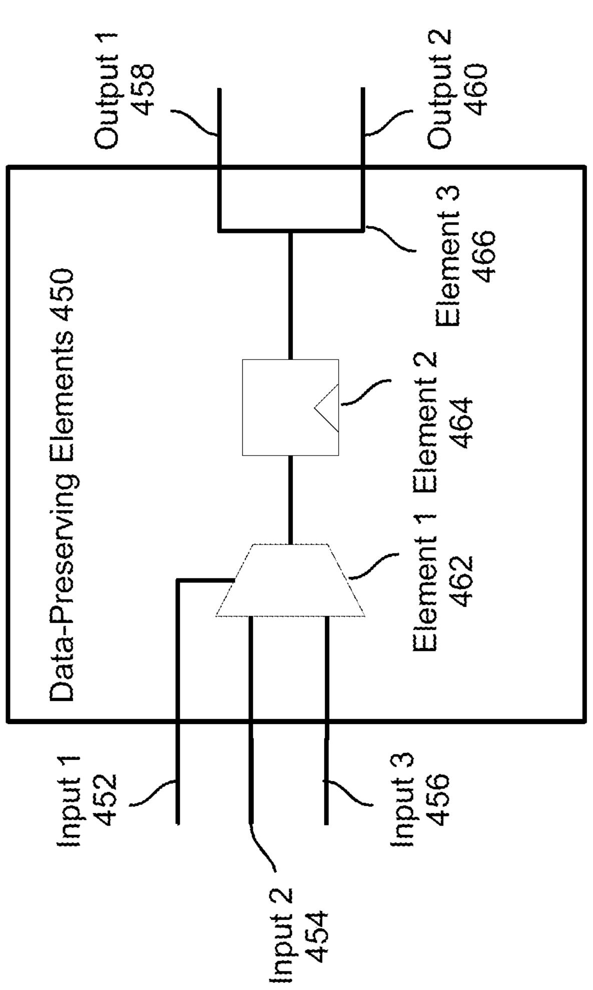
Figure 4C:
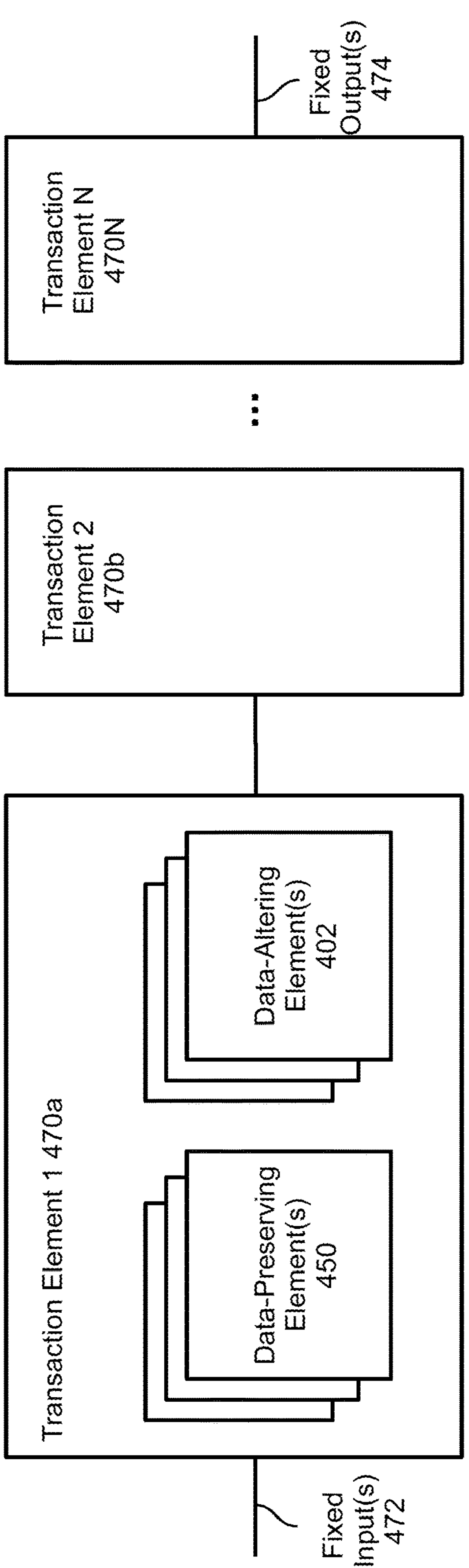

FIGS. 4A-4C illustrate electronic circuit elements used in hardware-based emulation according to embodiments of the present disclosure. As the terms are used herein, "circuit element" refers to any transistor, logic gate, flip-flop, FIFO structure, queue structure, memory, fan-out connection, fan-in connection, etc., that may be referenced in the HDL description 120. Circuit elements may be divided into two categories: data-altering elements and data-preserving elements. As those terms are used herein, a "data-altering element" include elements that perform an operation on or otherwise alter data inputs received by the element. Data-altering elements may include, for example, AND gates, OR gates, XOR gates, inverters, or any other such element that performs a Boolean or other such function on its inputs to produce corresponding outputs. A "data-preserving element" includes elements that do not alter data inputs and output a (perhaps time-delayed) signal that corresponds to the input signal. Data-preserving elements may include, for example, flip-flops, multiplexers, fan-in connections, fan-out connections, or other such structures.

Referring to FIG. 4A, a first data-altering element A 402 may include, for example, a first element 1 430 (e.g., an AND gate), a second element 2 432 (e.g., an inverter), and a third element 3 434 (e.g., an OR gate). The first data-altering element A 402 may receive inputs 410, 412, 414 and determine an output 416 that may differ from any of the inputs 410, 412, 414.

A second data-altering element A 404 may include, for example, a first element 1 440 (e.g., an AND gate), a second element 2 442 (e.g., an inverter), and a third element 3 444 (e.g., an OR gate). The second data-altering element A 404 may receive inputs 420, 422 and fixed input 424 and determine an output 426 and a fixed output 428. The present disclosure is not limited to data-altering elements with only the illustrated circuit elements; data-altering elements containing any number or type of similar circuit elements, and having any number of inputs or outputs, are within its scope.

The data-altering elements B 404 include a fixed input 424 and a fixed output 428. As the term is used herein, a "fixed" input or output is a signal that may not be transformed, migrated, or otherwise retimed using the techniques described herein. Examples of fixed inputs or outputs include processor (or other discrete element) inputs or outputs, inputs or outputs received or sent to non-programmable hardware or unchangeable software, or other such inputs or outputs. As explained below with reference to FIG. 6G, a data-altering element receiving or generating fixed inputs or outputs may be transformed into a first subset of circuit elements that receive or generate the fixed inputs and outputs and a second subset of circuit elements that do not receive or generate the fixed inputs or outputs.

Referring to FIG. 4B, data-preserving elements 450 may include one or more circuit elements that do not alter the data received as inputs. Such elements may include a first element 1 462 (e.g., a multiplexer), a second element 2 464 (e.g., a flip-flop), and/or a third element 3 466 (e.g., a fan-out connection). Other such elements, such as a fan-in connection, FIFO, queue, etc., are within the scope of the present disclosure. As explained in greater detail herein, a group of circuit elements containing data-altering elements and data-preserving elements may be transformed such that a data-preserving element originally downstream of the data-altering element is retimed to be upstream of the data-preserving element (and vice versa).

FIG. 4C defines transaction elements 470*a* . . . 470N as groups of circuit elements that comprise one or more data-preserving elements 450 and one or more data-altering elements 402 (with appropriate connections therebetween). Each transaction element 470*a* . . . 470N receives, as input, either a fixed input 472 or the output of another transaction element 470*a* . . . 470N. Each transaction element 470*a* . . . 470N further provides, as output, either an input to another transaction element 470*a* . . . 470N or a fixed output 474. Each transaction element 470*a* . . . 470N may not generate or receive further fixed outputs or inputs. The transformation techniques described herein may thus be applied to some or all of the transaction element 470*a* . . . 470N. In some embodiments, the data represented by the fixed inputs 472 may be referred to as a "transaction"; the data may correspond to a group of related signals that flow through the transaction elements 470*a* . . . 470N. Example transactions include, for example, instructions, packets, flits, etc.

Figure 5C:
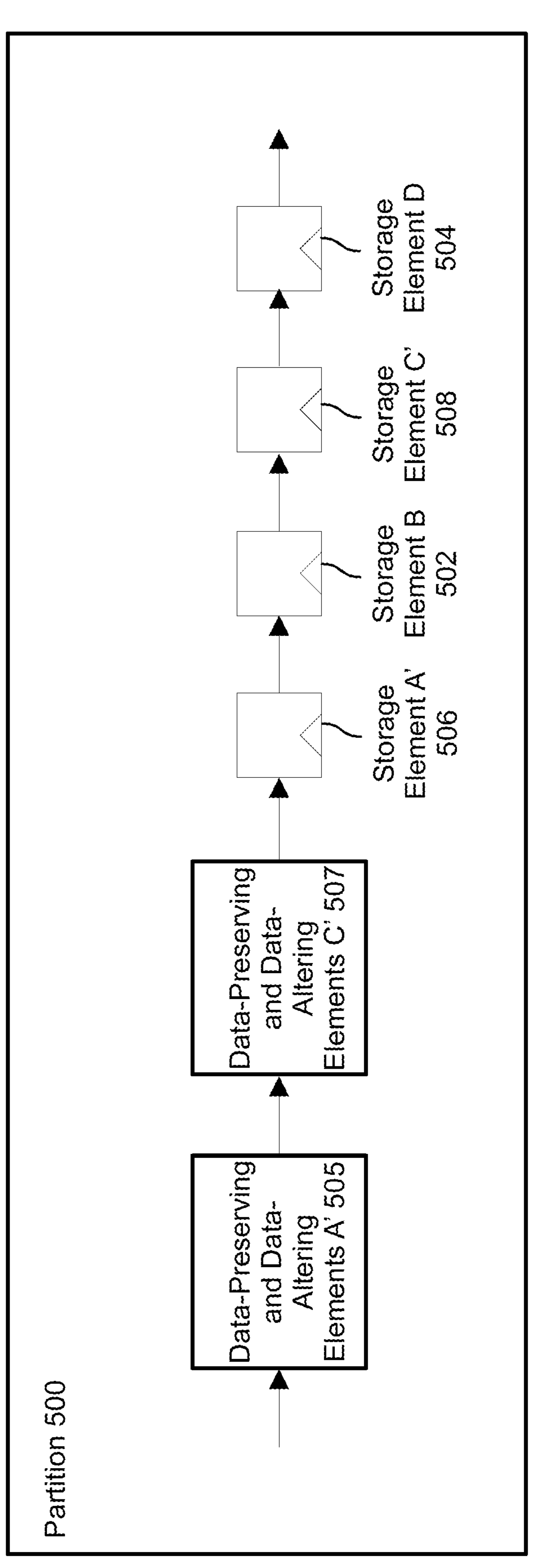

FIGS. 5A-5E illustrate systems and methods for creating sequence of storage elements by the sequence-of-storage-elements determination component 144 according to embodiments of the present disclosure. Referring first to FIG. 5A, a partition 500 may include groups of circuit elements that include a first group of data-preserving and data-altering elements A 501 and a second group of data-preserving and data-altering elements A 503. These elements 501, 503 may include any type of circuit element, including flip-flops, gates, multiplexers, FIFOs, or other such elements. The elements 501, 503 may be separated by one or more storage elements 502, 504, which may be flip-flops. The storage elements 502, 504 may be pipeline or "staging" flip-flops and may be present in the HDL description 120 to divide the elements 501, 503 such that they meet cycle-time requirements. The sequence-of-storage-elements determination component 144 may parse the HDL description 120 to determine that the elements 501, 502, 503, 504 are candidates for creation of a sequence of storage elements based on (for example) their composition and connections.

In FIG. 5B, the sequence-of-storage-elements determination component 144 may apply via the circuit-element transformation component 146 one or more of the transformations described herein to modify the elements 501, 503. As illustrated, the element 501 is transformed to retime at least one storage element A' 506 from the original data-preserving and data-altering elements A 501 such that its output is the input to the storage element B 502, leaving behind a modified data-preserving and data-altering elements A' 505 (that does not include the storage element A' 506). The sequence-of-storage-elements determination component 144 may similarly transform the data-preserving and data-altering elements C 503 to determine data-preserving and data-altering elements C' 507 and a storage element C' 508.

Although only two such transformations are shown in FIGS. 5A and 5B, the sequence-of-storage-elements determination component 144 may apply similar transformations to any number of elements. The present disclosure is similarly not limited to transformations in only one partition; any number of partitions may include circuit elements that may be similarly transformed.

Referring to FIG. 5C, the sequence-of-storage-elements determination component 144 may then transform the elements of the partition 500, using one or more of the techniques described herein, such that the data-preserving and data-altering elements 505, 507 are disposed together on the upstream end of the path and such that the storage elements 506, 502, 508, 504 are disposed together on the downstream end of the path.

Figure 5D:
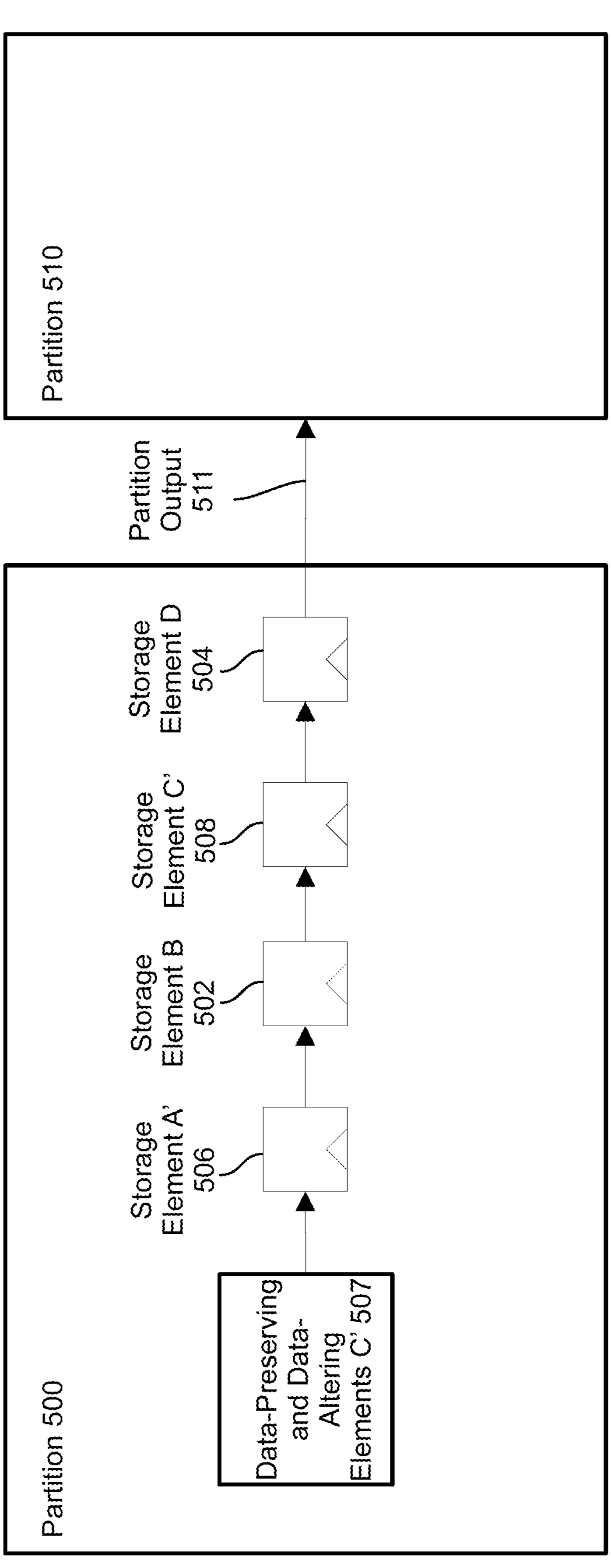

Referring to FIG. 5D, a downstream partition 510 may receive the partition output 511 of the upstream partition 500. In accordance with embodiments of the present disclosure however, because the storage elements 502, 504, 506, 508 are positioned in accordance with the disclosure of FIGS. 5A-5C, and because the storage elements 502, 504, 506, 508 are data-preserving elements, the storage elements 502, 506, 508 store values that will be output by the partition output 511 in future clock cycles. The outputs of the storage elements 502, 504, 506, 508 may be stored in a FIFO 515 in the downstream partition 510 (or in any other such storage element(s)).

FIG. 5D illustrates a sequence of storage elements including four storage elements 506, 502, 508, 504. The present disclosure is not, however, limited to only this number of storage elements, and any number may be disposed in a sequence of storage elements. The more storage elements, the greater the inter-FPGA latency may be compensated. The storage elements 502, 504, 506, 508 may be modeled by a FIFO, which may then provide the values of the storage elements 502, 504, 506, 508 to the downstream partition 510.

As described above, the sequence of storage elements formed by the storage elements 502, 504, 506, 508 may be determined to be disposed, by the sequence-of-storage-elements determination component 144, to correspond to a connection between programmable hardware components. The disposition of the sequence of storage elements may thus wholly or partially compensate for the limit to clock cycle time imposed by the connection. For example, if the latency between two FPGAs is 100 clock cycles, the sequence of storage elements may effectively "pipeline" that latency such that a higher clock frequency is possible.

Figure 5E:
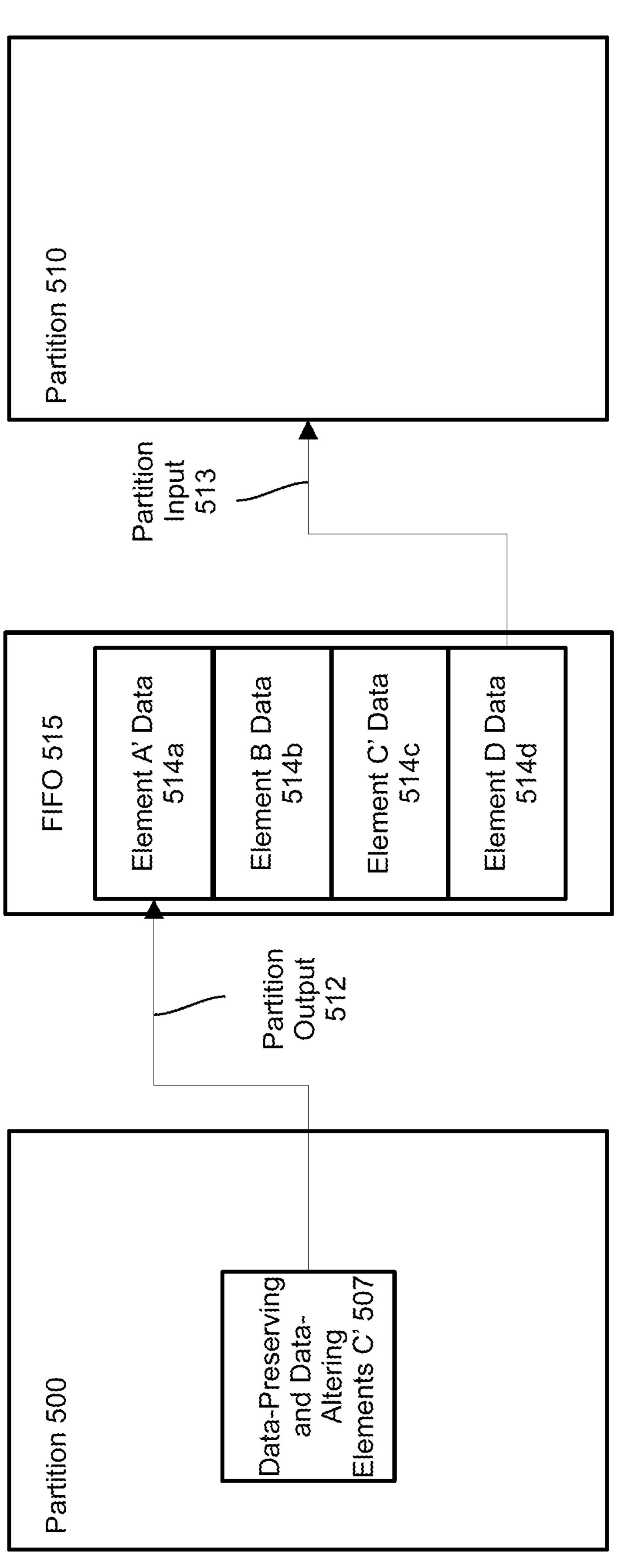

FIG. 5E illustrates that the storage elements 502, 504, 506, 508 may be replaced by a FIFO 515. The FIFO 515 may be modeled in hardware or software. The downstream partition 510 may request values from the FIFO 515 rather than from the partition 500 to compensate for inter-FPGA latency and/or to compensate for a stall of the upstream partition 500.

FIGS. 6A-6G illustrate techniques for transforming circuit elements using the circuit-element transformation component 146 according to embodiments of the present disclosure. In these figures, the circuit-element transformation component 146 may parse the HDL description 120 to determine which, if any, circuit elements match the topology of any of the transformations described herein and may thereafter apply the one or more transformations. The transformations are reversible in the sense that they may be applied in either direction (as indicated by the double arrows in the figures). The circuit-element transformation component 146 may be directed to apply a transformation by, for example, the sequence-of-storage-elements determination component 144 and/or the storage-elements size-reduction component 148.

Figure 6A:
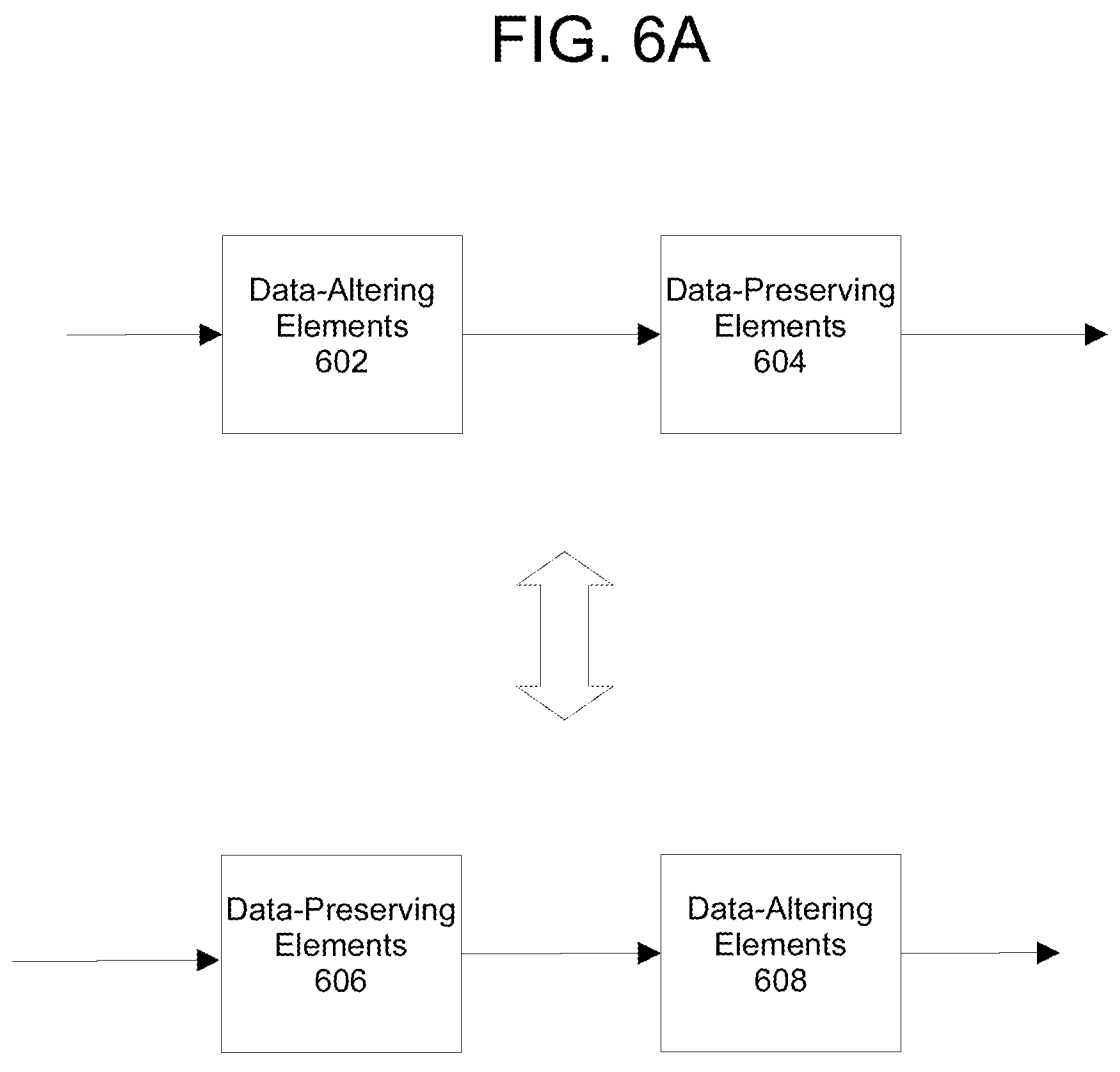

Referring first to FIG. 6A, a first group of data-altering elements 602 (e.g., combinational logic) may be disposed upstream of a group of data-preserving elements 604 (e.g., one or more flip-flops). The elements 602, 604 may be migrated as shown such that the data-preserving elements 606 are upstream of the data-altering elements 608 (and vice versa). The two groups of data-altering elements 602, 608 may be equivalent (though they may be represented using different object names in the transformed HDL description 122). The two groups of data-preserving elements 604 may be the same or different in the number of storage elements contained therein; if the data-altering elements 602 differ in their numbers of inputs compared to their numbers of outputs, the size of the data-preserving elements 604 may change accordingly to process the different numbers of inputs and outputs.

FIG. 6B illustrates a transformation of a group of circuit elements including a multiplexer 610, data-processing elements 612, and data-altering elements 616. Similar to FIG. 6A, the data-altering elements 616 may be transformed into data-altering elements 618 that appear at the input of a multiplexer 620 rather than at the output of the data-altering elements 616. Data-preserving elements 622 may similarly change in size with respect to the data-preserving elements 612 to account for differences in the number of inputs versus outputs of the data-altering elements 618.

FIG. 6C illustrates a similar transformation involving a group of circuit elements that includes an array 624 having array entries 628*a* . . . 628*n* (which may be considered data-preserving elements). Data-altering elements 626 downstream of the array may be similarly transformed to be data-altering elements 634 disposed upstream of an array 636 having array entries 638*a* . . . 638*n*. The reverse transformation is also within the scope of the present disclosure.

FIG. 6D illustrates a similar transformation involving a group of circuit elements that includes a ring 640 having ring elements 642*a* . . . 642*n* (which may be considered data-preserving elements). Data-altering elements 644 providing inputs to each ring element 642 may be similarly transformed to be data-altering elements 650 processing outputs of a ring 646 having ring entries 648*a* . . . 648*n*. The reverse transformation is also within the scope of the present disclosure.

FIG. 6E illustrates a transformation of a number of identical circuit element instances 652*n* (each containing identical circuit elements) into a group of circuit elements that re-uses a single instance of combinatorial elements 656 via time-domain multiplexing. Each instance 652 also includes flip-flops 654. The instances 652 may be transformed as shown such that N instances of flip-flops 658*a* . . . 658*n* provide an input to the single instance of the combinatorial elements 662. The time-domain multiplexing of the combinatorial elements may be performed by using a multiplexer 660 to select one of N inputs corresponding to each time domain and by a sampler 664 to select an output of the combinatorial elements 662 corresponding to the time domain. Each of the flip-flops 658 thus also store a value corresponding to each time domain.

Figure 6F:
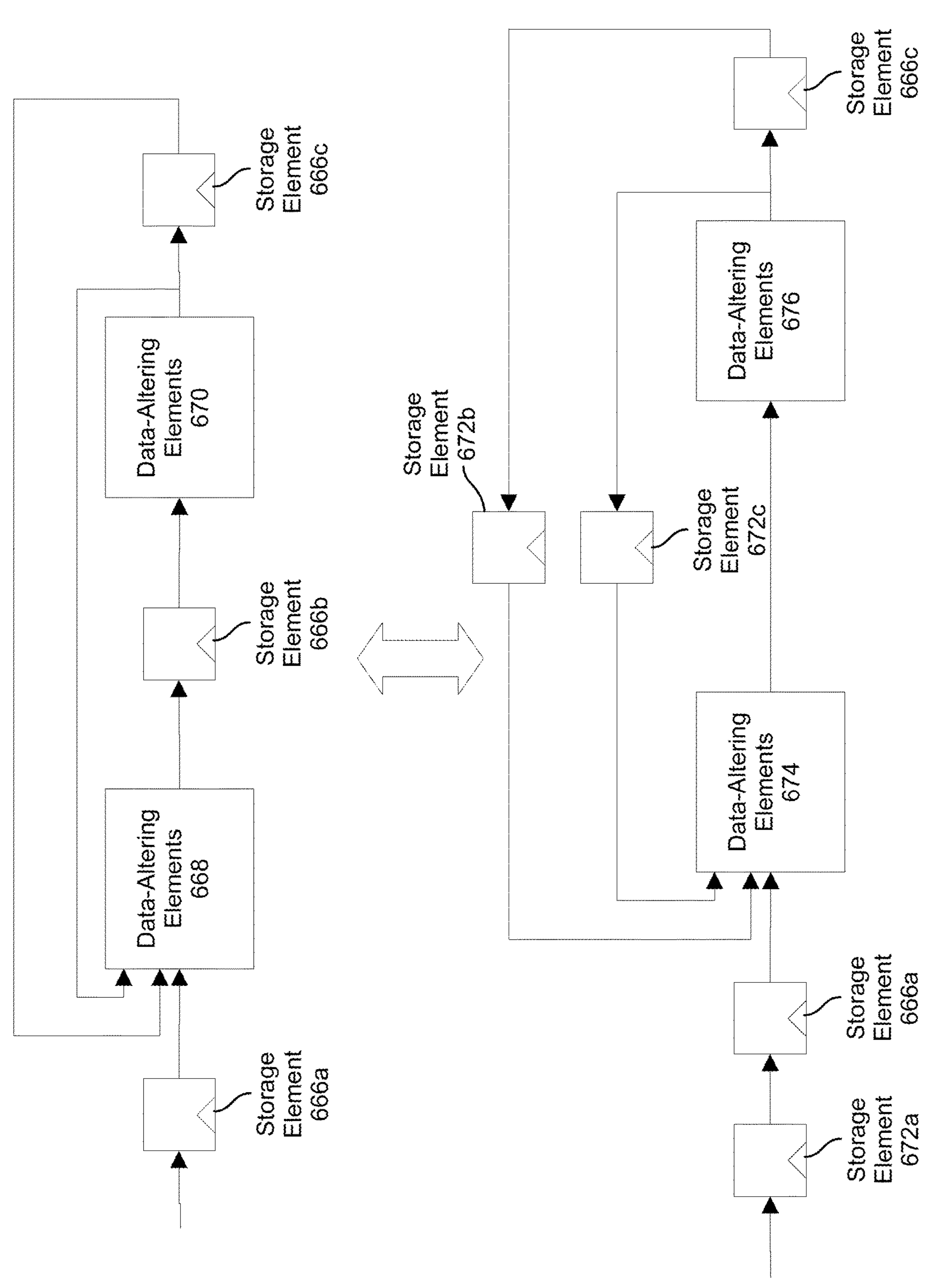

FIG. 6F illustrates a transformation of a number of circuit elements including data-altering elements 668, 670 separated by storage elements 666*a*, 666*b*, 666*c*. The output of the data-altering elements 670 and of the storage element 666*c* feed back to be inputs to the data-altering elements 668. Though the figure depicts two groups of data-altering elements 668, 670 and two feedback paths, the figure may be generalized to include any number of groups of data-altering elements, storage elements, and feedback paths.

The transformation includes removing the storage element 666*b* and directly connecting data-altering elements 674 to data-altering elements 676. To compensate for this removal, an additional storage element 672*a* is added to the input to the data-altering elements 674 and additional storage elements 672*b*, 672*c* are added to the feedback outputs of the data altering elements 676 and the storage element 666*c*. If the circuit elements include additional groups of data-altering elements, corresponding additional storage elements may be added in the same locations.

FIG. 6G illustrates a transformation involving a group of data-altering elements 608 that receives inputs 682 via a storage element 694*a* and determines outputs 686 via a storage element 694*b*. The data-altering elements 680 also receive one or more fixed inputs 684 and/or determine one or more fixed outputs 688. As explained herein, due to the fixed inputs 684 and/or fixed outputs 690, the data-altering elements 680 may not be transformed using the storage elements 694*a*, 694*b*.

The circuit-element transformation component 146 may thus transform the data-altering elements 680 into two (potentially non-overlapping) subsets: a first subset of data-altering elements 680*a* required to determine the fixed output 688 using the inputs 682 and fixed inputs 684 and a second subset of data-altering elements 680*b* that does not determine the fixed output 688 yet determines the output 686. The storage element 696*b*, data-altering elements 680*b*, and/or storage element 696*c* may thus be retimed using one or more of the techniques described herein.

Figure 7A:
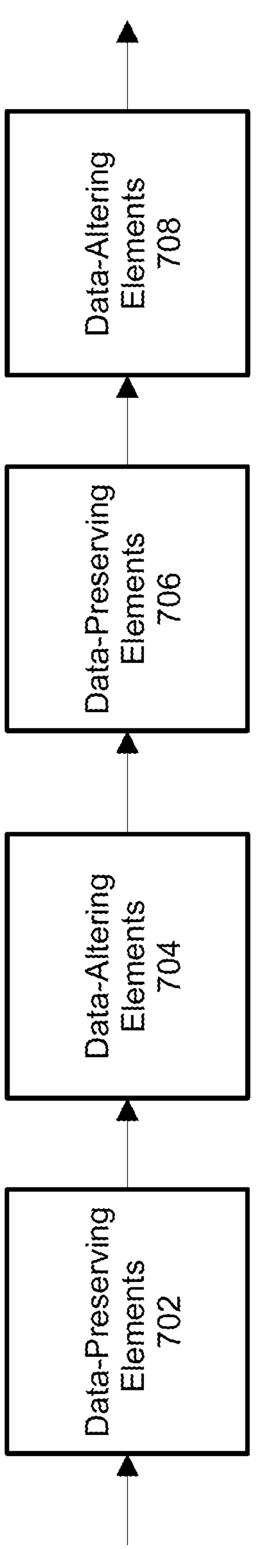
FIGS. 7A-7D illustrate systems and methods for reducing the area required for storage elements used for emulation according to embodiments of the present disclosure.

FIGS. 7A-7D illustrate systems and methods for reducing the area required for storage elements used for emulation, using the storage-elements size reduction component 148, according to embodiments of the present disclosure. Referring first to FIG. 7A, the storage-elements size reduction component 148 may first process the HDL description 120 to identify a number of circuit elements that are candidates for storage-element area reduction. For example, as shown in FIG. 7A, the circuit elements may include data-preserving elements 702, 706 and data-altering elements 704, 708 arranged as shown. Any number of data-preserving and -altering elements and any arrangement thereof is within the scope of the present disclosure, however. In some embodiments, the elements do not receive fixed inputs nor determine fixed outputs (e.g., they process transactions as described in, for example, FIG. 4C).

Figures 7B, 7C:
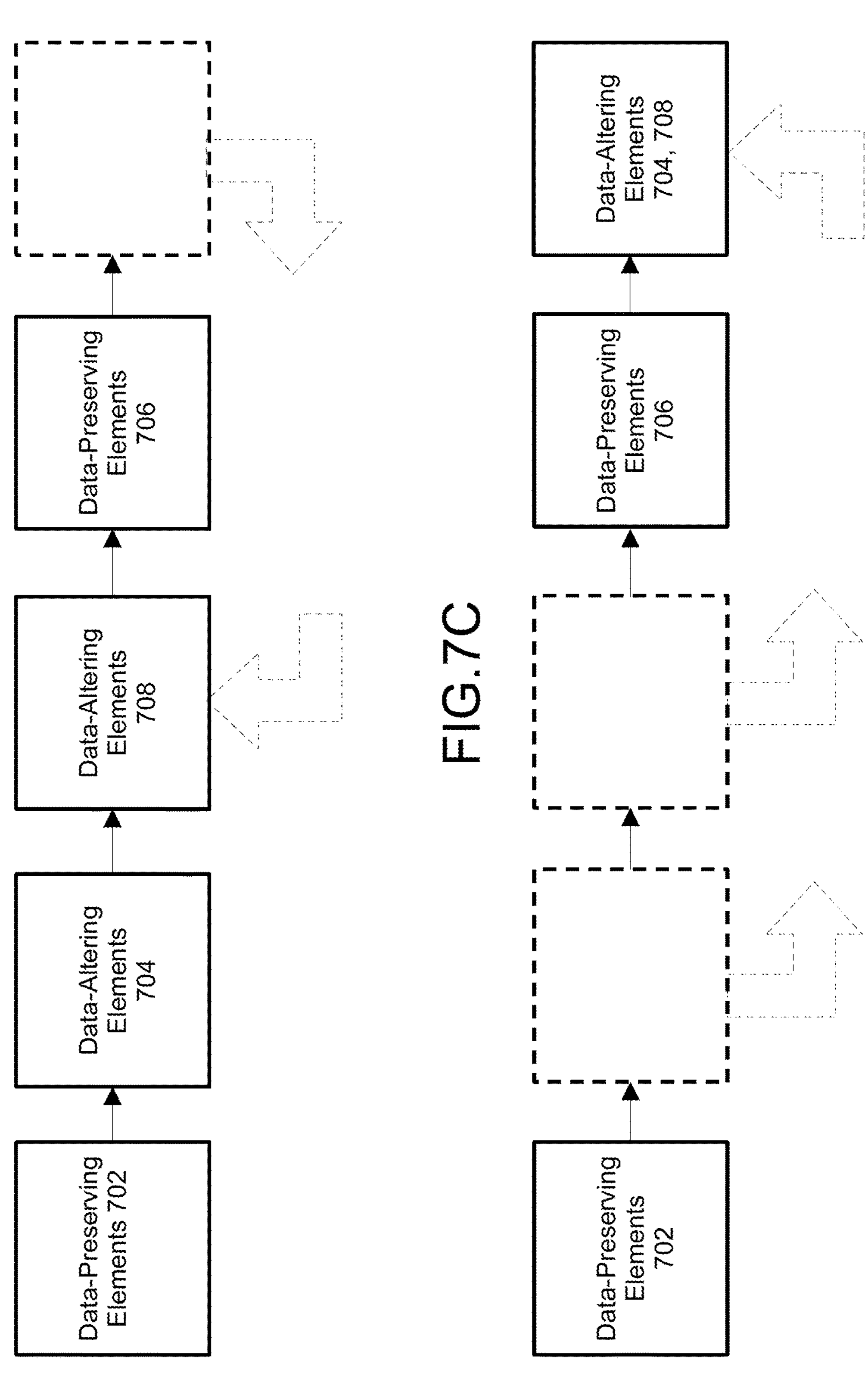

As shown in FIG. 7B, one or more of the data-altering elements 704, 708 may be transformed by retiming it by moving it upstream (e.g., to the left of the figure) across one or more data-preserving elements 702, 706 in accordance with the techniques described herein. In some embodiments, the first group of data-altering elements 704 may be wholly or partially merged with the second group of data-altering elements 708; this merging may result in an overall reduction of circuit elements and/or the area required to program the circuit elements into the programmable hardware element(s). Though FIG. 7B illustrates one such transformation, embodiments of the present disclosure include similarly transforming any number of data-altering elements upstream of any number of data-preserving elements.

Figure 7D:
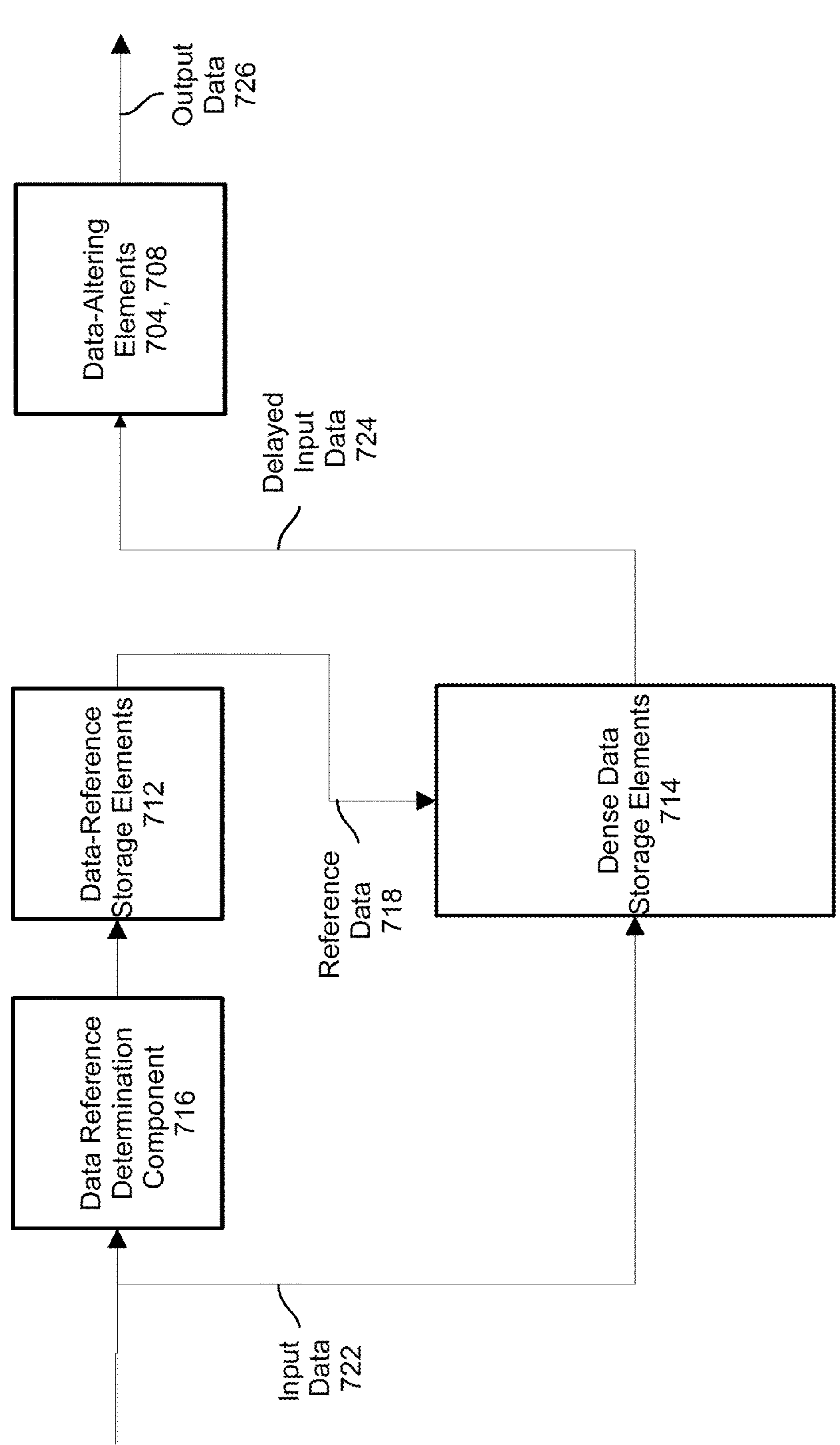

FIG. 7C illustrates that the (potentially) merged and/or transformed data-preserving elements may then be transformed such that they are moved downstream across one or more data-preserving elements. As illustrated, the (potentially) merged data-altering elements 704 and data-altering elements 708 are transformed such that they are moved downstream of the data-preserving elements 706. Such transformations may reduce the size required to store data in the data-preserving elements 702, 706 as shown in FIG. 7D. Although the upstream transformations/merging illustrated in FIG. 7B and the downstream transformations of FIG. 7C are illustrated as two steps, one of skill in the art will understand that, in other embodiments, these two steps may be preformed as a single step. Any method of such transformation and merging is within the scope of the present disclosure.

Referring to FIG. 7D, the data-preserving elements 702, 706 may be replaced by data-reference storage elements 712 and dense data storage elements 714 to thereby reduce the overall circuit area required to store the input data 722. Storing data in the data-preserving elements 702, 706 may be expensive in FPGA area; if, for example, the input data 722 is 1024 bits wide, and if the data-preserving elements 702, 706 correspond to 10 cycles of latency, the total number of flip-flops required to implement the data-preserving elements 702, 706 may be 1024×10=10,240 flip-flops; this number of flip-flops may be impossible to allocate on a single FPGA and/or may consume an unacceptable number of FPGA resources.

Embodiments of the present invention thus store only a reference value in the flip-flops (or other such less-dense storage elements); this reference indicates an entry in dense data storage elements 714, which hold the actual data values. The dense data storage elements 714 may include dense storage such as a computer-memory structure (e.g., an array, FIFO, and/or queue implemented in computer memory), dedicated array hardware on the FPGA, or other such dense memory. "Dense" storage is defined as any storage that is capable of storing a number of data signals in such a way that the dense storage consumes less FPGA area and/or resources than less-dense storage (e.g., flip-flops) configured to store the same number of data signals.

In various embodiments, a data-reference determination component 716 may receive input data 722 and may generate reference data corresponding to an entry in the dense data-storage elements 714 holding the data 722. The size of the reference data (e.g., the number of bits required for the reference value) may correspond to the number of entries required in the dense data-storage elements 714. The number of entries may depend on the number of cycles of latency of the data-preserving elements 702, 706.

The dense data-storage elements 714 may store the input data in an entry corresponding to the determined reference value. The data-reference storage elements 712 may then process the determined reference value by, for example, storing it in a sequence of flip-flops corresponding to the original latency of the data-preserving elements 702, 706. The data-reference storage element 712 may thus have the same topology as the original data-preserving elements 702, 706. The topology of a circuit refers to the particular types of circuit elements therein and their particular connections therebetween. For example, if the data-preserving elements 702, 706 include one or more multiplexers, branches, joins, queues, FIFOs, etc. connected a particular way, the data-reference storage element 712 may have corresponding elements connected the same way. The data-reference storage element 712 may differ from the data-preserving elements 702, 706 only in the number of storage elements contained therein; the data-reference storage element 712 may have a number of flip-flops, for example, much less than the number of flip-flops contained in the original circuit (at least because the data-reference storage element 712 stores only references to the data, while the data-preserving elements 702, 706 store the actual data).

When the determined reference data 718 is output by the data-reference storage elements 712, it may be used to indicate the corresponding data value as stored in the dense data-storage elements 714. The dense data-storage elements 714 may then output the input data 722 as delayed input data 724 (e.g., delayed in accordance with the original latency), which may then be processed by the data-altering elements 704, 708 to determine output data 726.

Continuing the above example, if the input data is 1024 bits wide and if the latency of the data-preserving elements 702, 706 is ten cycles, the reference data may be determined to be 4 bits in size to address at least 10 entries in the dense data-storage elements 714. The number of flip-flops required for the data-reference storage elements 712 may thus be 10×4=40 flip-flops (as compared to the 10,240 flip-flops required to implement the data-preserving elements 702, 706), resulting in a large savings in FPGA area/resources.

Furthermore, while each entry in the dense data-storage elements 714 may be at least 1024 bits wide to store each item of input data 722, the dense data-storage elements 714 need not allocate additional entries to account for the latency of the data-preserving elements 702, 706; the dense data-storage elements 714 may store each item of input data 722 only once and then output corresponding delayed input data 724 when the reference data 718 so indicates. In other words, while the data-preserving elements 702, 706 may include a large number of flip-flops to store each of the 1024 bits of the input data 722 in each stage of a pipeline as it propagates through a pipeline, the dense data-storage elements may store the 1024 bits only once and model the delay of the pipeline by outputting the input data 722 only when indicated by the reference data 718.

Although FIG. 7D illustrates only one replacement of less-dense storage with more-dense storage (e.g., the dense data-storage elements 714), the present disclosure is not limited to only one such replacement, and any number of similar replacements is within its scope.

Figure 8B:
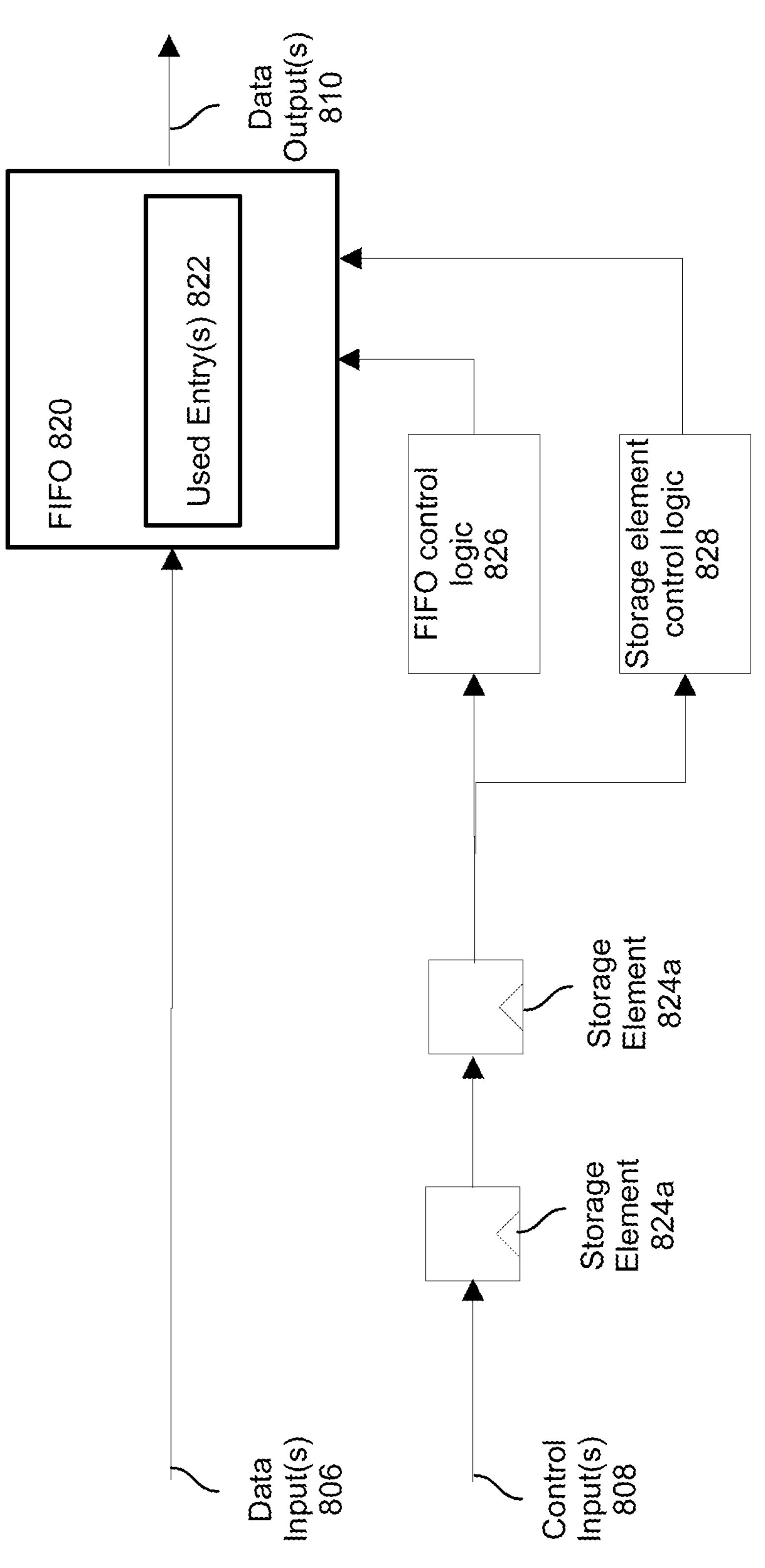
Figure 8C:
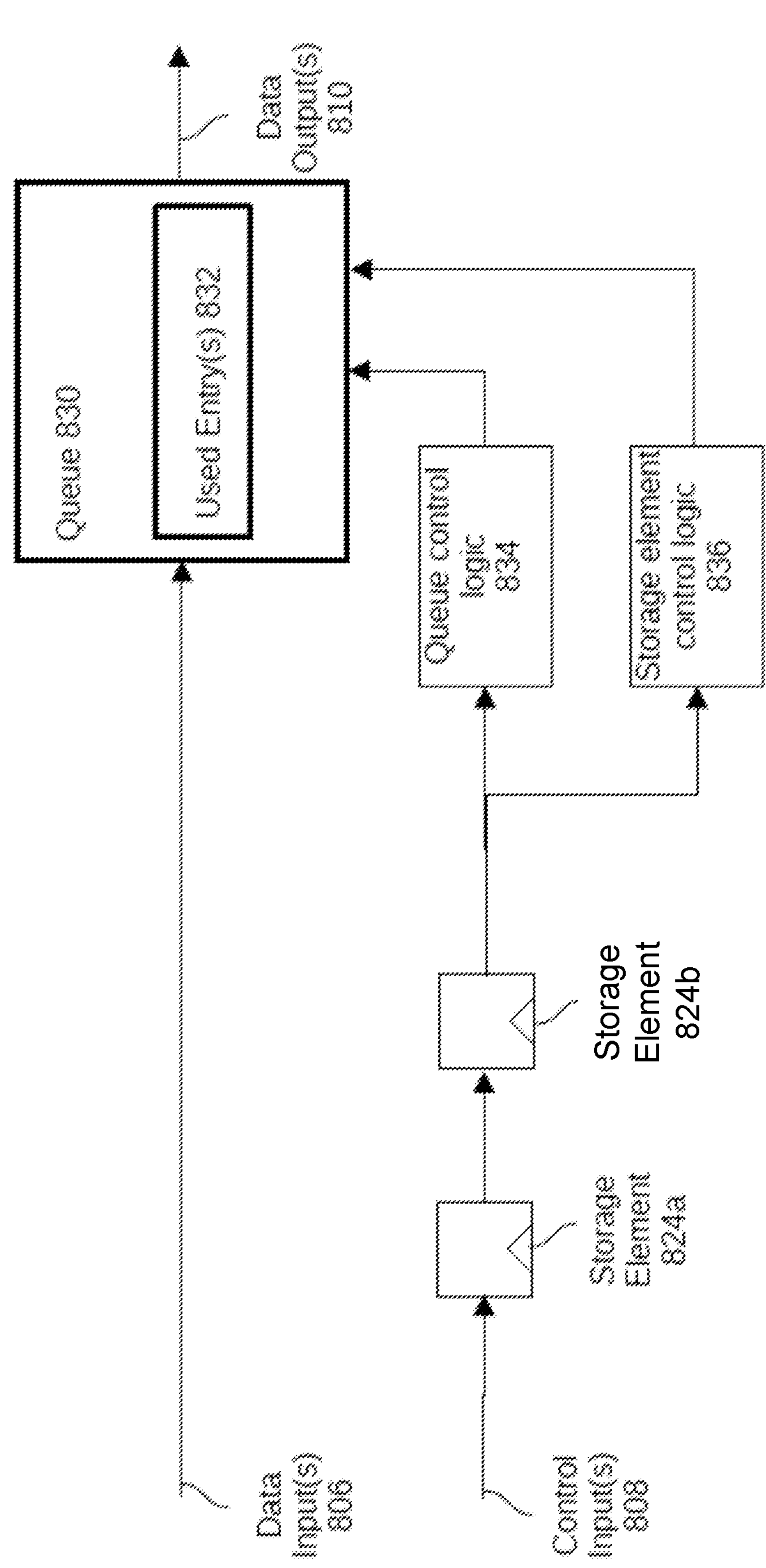

FIGS. 8A-8C illustrate systems and methods for absorbing storage elements into larger storage elements, using the storage-elements absorption component 150 according to embodiments of the present disclosure. Referring first to FIG. 8A, such a larger storage element may be a FIFO or queue 800; this large storage may be implemented wholly or partially in dense storage on an FPGA, meaning that storing a value in the FIFO/queue may be more area-efficient than storing a value in a storage element 812*a*, 812*b* (such as a flip-flop). The FIFO/queue 800 may include used entries 802 (e.g., the entries to implement the FIFO or queue) as well as unused entries 804. For example, the FIFO or queue may be implemented in hardware to store 64 entries but the particular FIFO or queue may require only 32 entries. The unused entries may thus represent unallocated or wasted resources.

As the terms are used herein, a FIFO is a data structure than stores a first value in accordance with a control input 808 and FIFO/queue control logic 814 (e.g., a first-in value or a most-recently stored value) and outputs a second value in accordance with a control input 808 (e.g., a last-in or least-recently stored value). A queue is a data structure that maintains a first pointer to a "head" of the queue and a second pointer to the "tail" of the queue; when directed by the control signal 808, the queue returns a value at the head of the queue (and updates the first pointer accordingly) and stores a new value to the tail of the queue (and updates the second pointer accordingly).

FIG. 8A further illustrates that storage elements 812*a*, 812*b* may be transformed by moving either or both of them upstream or downstream of the FIFO/queue 800. As illustrated, the storage elements 812*a*, 812*b* are transformed to be downstream of the FIFO/queue 800; in other embodiments, any number of storage elements may be transformed in accordance with the techniques described herein.

Referring to FIG. 8B, the storage elements 812*a*, 812*b* may be absorbed into the FIFO 820 by allocating some or all of the unused entries 804; the used entries 822 may thus represent entries corresponding to the FIFO or queue as well as entries corresponding to the absorbed storage elements 812*a*, 812*b*. Additional storage elements 824*a*, 824*b* may be disposed on the control inputs 808 to account for the absorption of the storage elements 812*a*, 812*b*. Because the size (e.g., width) of the data inputs 806 is typically much larger than the size (e.g., width) of the control inputs 808, fewer storage elements (e.g., flip-flops) are required to implement the storage elements 824*a*, 824*b* as compared to the number of storage elements required to implement the storage elements 812*a*, 812*b*.

In various embodiments, FIFO control logic 826 may process the control inputs 808 to implement the first-in-first-out behavior of the FIFO described above. Because the absorbed storage elements 812*a*, 812*b* are not part of the FIFO, separate storage-element control logic 828 may be used to replicate the behavior of the storage elements 812*a*, 812*b* (e.g., capture the input data 806 and provide the output data 810).

The absorbing of the storage elements 812*a*, 812*b* may not consume all of the unused entries 804 in the FIFO 820; other storage elements may be further absorbed into the FIFO 820. Further, as illustrated, the FIFO 820 absorbs two connected storage elements 812*a*, 812*b* but, as described herein, transformations may be applied to create larger sequences of storage elements, which may also be absorbed into the FIFO 820.

FIG. 8C is similar to FIG. 8B but illustrates absorption of the storage elements 812*a*, 812*b* into a queue 830 having used entries 832. Queue control logic 834 may be used to implement the head/tail output/input functions described above, and storage element control logic 836 may be used to control the entries in the queue corresponding to the storage elements 812*a*, 812*b*.

Figure 9B:
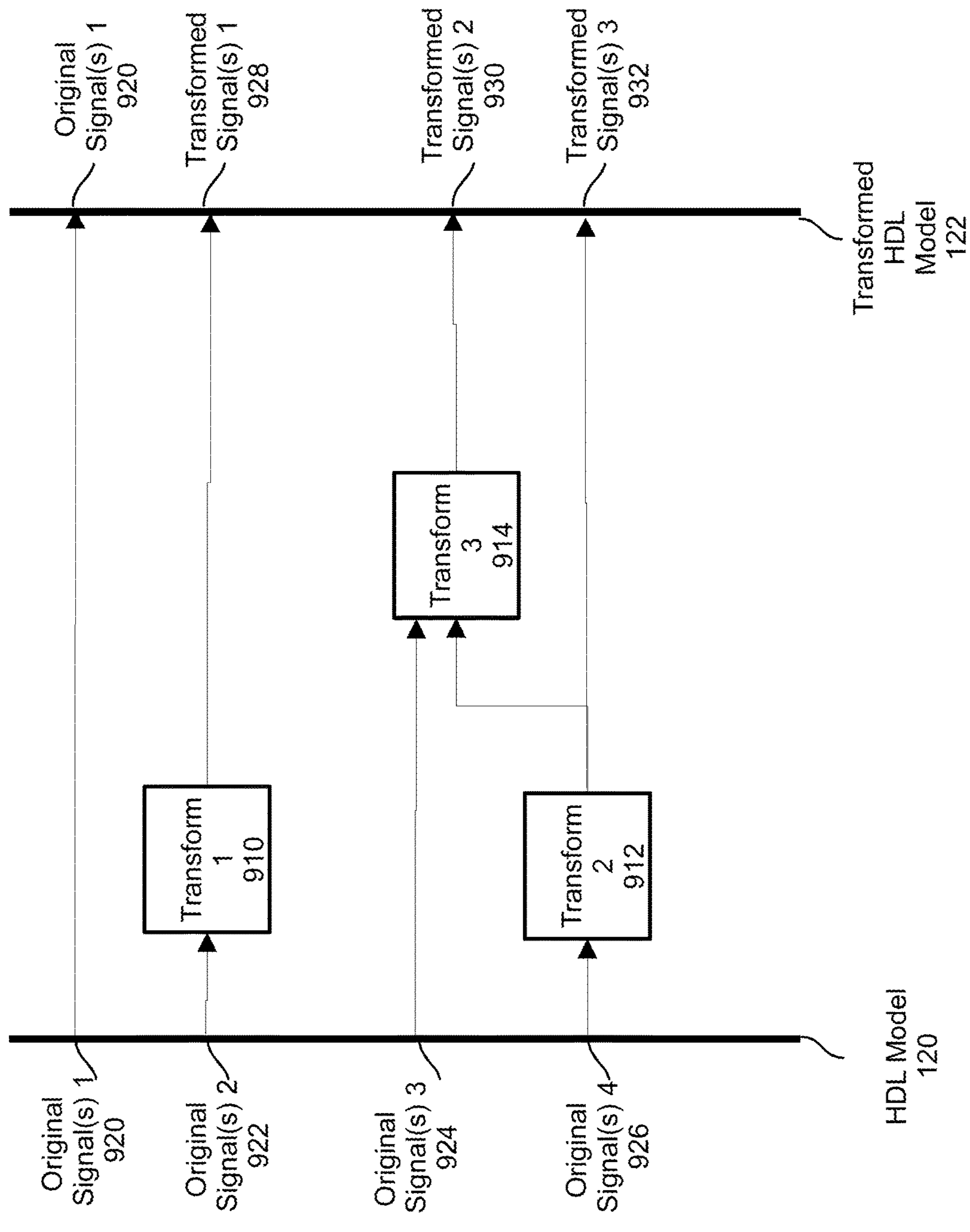

FIGS. 9A-9B illustrate systems and methods for remapping transformed signals, using the signal-remapping component 152, according to embodiments of the present disclosure. Referring first to FIG. 9A, a number of transformations 910, 912, 914 may be applied to the HDL description 120 as described therein; these transformations may alter the circuit elements of the HDL description 120 such that original signals 922, 924, 926 of the HDL description 120 no longer appear in the transformed HDL description 122; instead, a number of transformed signals 928, 930, 932 may wholly or partially replace the original signals 922, 924, 926. A user 112 may, however, wish to examine values of the original signals 922, 924, 926 on a display 1018 of the user device 110; the values of the transformed signals 928, 930, 932 may be of no interest to the user 112. The following figures thus describe a system and method for remapping values of the transformed signals to derive the original signals.

Some original signals 920 of the HDL description 120 may not be transformed; these signals thus remain in the transformed HDL description 122 (represented in the figure as the model that results after N steps of transformation) and remapping of these signals is not necessary.

In some embodiments, original signals 922 are transformed, by a single transform 1 910 to produce transformed signals 1 928. In other embodiments, multiple transforms may affect the same original signals. For example, original signals 926 may be affected by a transform 2 912; some of the resultant transformed signals 932 may appear in the transformed HDL description 122, while other of the resultant transformed signals 932 may be further transformed by a transform 3 914. The transform 3 914 may further transform additional original signals 924 to produce transformed signals 2 932. Other sequences of transforms that may re-transform already transformed signals and/or transform further original signals are within the scope of the present disclosure.

In various embodiments, as the transformations are applied, data representing the transforms and the input and output signals affected thereby are stored in a computer memory or similar structure. For example, at the transformed model step 1 902, data may be stored corresponding to the transform 2 912, the original signals 922, and the transformed signals 932. At the transformed model step 2

904, data may be stored corresponding to the transform 1 910, the original signals 926, and the transformed signals 1 928. Similarly, at the transformed model step 3 906, data may be stored corresponding to the transform 3 914, the original signals 924, the subset of the transformed signals 932 processed by the transform 3 914, and the transformed signals 4 932.

Given this storage of the transforms 910, 912, 914 and the original signals processed thereby, if and when the user 112 inputs an indication to the user device 110 to display a value of an original signal affected by one or more transforms, the signal-remapping component 152 may use this stored transform data to determine the transformed signals corresponding to the original signal and process the transformed signals by recursively applying reverse transformations corresponding to the performed transformations to derive a value of the original signal. For example, to determine a value of the original signals 4 926, the signal-remapping component 152 may determine, using the stored data, that the corresponding transformed signals are the transformed signals 2 930 and 3 932 (as transformed by the transformation 2 912 and the transformation 3 914. The signal-remapping component 152 may then process the transformed signals 2 930 and 3 932 by first applying a first reverse transformation corresponding to the transform 3 914 and then applying a second reverse transformation corresponding to the transform 2 912.

The present disclosure is not limited to only these types or numbers of transforms and to the reverse-mapping of these signals; one of skill in the art will understand than any number of transformation steps and any combination of reverse transforms are within its scope.

Referring to FIG. 9B, in some embodiments, the signal-remapping component 152 may not store data corresponding to each step of the transformation process, as described above, but may create a condensed representation of the transforms that directly maps signals of the transformed HDL model 122 (e.g., step N 908 of the transformation process). The signal-remapping component 152 may then recursively apply reverse transforms to the relevant signals in accordance with the condensed representation.

FIG. 10 is a block diagram illustrating a user device 110. FIG. 11 is a block diagram illustrating example components of a remote system 1100, which may be one or more servers and may include the model-transformation system 102, the model-synthesis system 104, and/or the model-emulation system 106. The term "system" as used herein may refer to a traditional system as understood in a system/client computing structure but may also refer to a number of different computing components that may assist with the operations discussed herein. For example, a server may include one or more physical computing components (such as a rack system) that are connected to other devices/components either physically or over a network and is capable of performing computing operations. A server may also include one or more virtual machines that emulates a computer system and is run on one or across multiple devices. A server may also include other combinations of hardware, software, firmware, or the like to perform operations discussed herein. The server may be configured to operate using one or more of a client-system model or other computing techniques.

Multiple servers may be included in the remote system 1100, such as one or more servers for emulating operation of an electronic circuit. In operation, each of these server (or groups of servers) may include computer-readable and computer-executable instructions that reside on the respective server, as will be discussed further below. Each of these devices/systems 110/1100 may include one or more I/O device interfaces 1002/1102 for enabling communication over the network 100. Each of these devices/systems 110/1100 may include one or more controllers/processors 1004/1104, which may each include a central processing unit (CPU) for processing data and computer-readable instructions, and a memory 1006/1106 for storing data and instructions of the respective device. The memories 1006/1106 may individually include volatile random access memory (RAM), non-volatile read only memory (ROM), non-volatile magneto-resistive memory (MRAM), or other types of memory. Each device/system 110/1100 may also include a data-storage component 1008/1108 for storing data and controller/processor-executable instructions. Each data-storage component 1008/1108 may individually include one or more non-volatile storage types such as magnetic storage, optical storage, solid-state storage, etc. Each device/system 110/1100 may also be connected to removable or external non-volatile memory or storage (such as a removable memory card, memory key drive, networked storage, etc.) through respective input/output device interfaces 1002/1102. The user device 110 may further include an antenna 1012, microphone 1014, loudspeaker 1016, and/or display 1018.

Computer instructions for operating each device/system 110/1100 and its various components may be executed by the respective device's/system's controller(s)/processor(s) 1004/1104, using the memory 1006/1106 as temporary "working" storage at runtime. The computer instructions may be stored in a non-transitory manner in non-volatile memory 1006/1106, storage 1008/1108, and/or an external device(s). Alternatively, some or all of the executable instructions may be embedded in hardware or firmware on the respective device in addition to or instead of software.

Each device/system 110/1100 includes input/output device interfaces 1002/1102. A variety of components may be connected through the input/output device interfaces 1002/1102, as will be discussed further below. Additionally, each device/system 110/1100 may include an address/data bus 1010/1110 for conveying data among components of the respective device/system. Each component within a device/system 110/1110 may also be directly connected to other components in addition to (or instead of) being connected to other components across the bus 1010/1110.

The device 110 may include input/output device interfaces 1002 that connect to a variety of components such as an audio output component, a wired headset, or a wireless headset, or other component capable of outputting audio. The device 110 may also include an audio capture component. The audio capture component may be, for example, the microphone 1014 or array of microphones, a wired headset, or a wireless headset, etc.

Via antenna(s) 1012, the input/output device interfaces 1002 may connect to one or more networks 100 via a wireless local area network (WLAN) (such as Wi-Fi) radio, Bluetooth, or wireless network radio, such as a radio capable of communication with a wireless communication network such as a Long Term Evolution (LTE) network, WiMAX network, 3G network, 4G network, 5G network, etc. A wired connection such as Ethernet may also be supported. Through the network(s) 100, the system may be distributed across a networked environment. The I/O device interface 1002/1102 may also include communication components that allow data to be exchanged between devices such as different physical systems in a collection of systems or other components.

Figure 12:
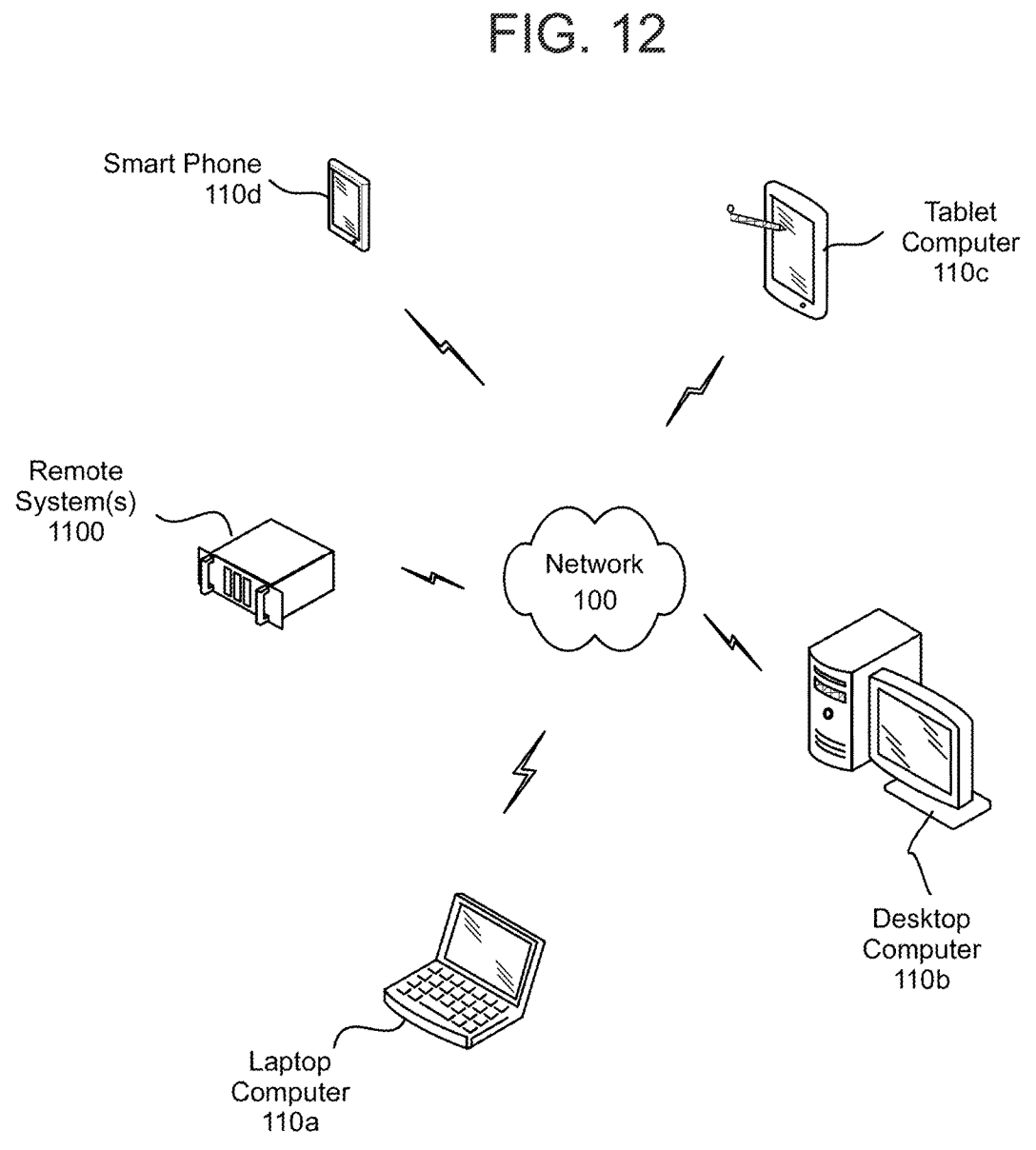

Referring to FIG. 12, as noted above, multiple devices 110 may be employed in a single system. In such a multi-device system, each of the devices may include different components for performing different aspects of the system's processing. The multiple devices may include overlapping components. The components of the device 110 or the system 1100, as described herein, are illustrative, and may be located as a stand-alone device or may be included, in whole or in part, as a component of a larger device or system.

The network 100 may further connect user devices 110 such as a laptop computer 110*a*, a desktop computer 110*b*, a tablet computer 110*c*, and/or a smart phone 110*d* through a wireless service provider, over a Wi-Fi or cellular network connection, or the like. Other devices may be included as network-connected support devices, such as a remote system 1100. The support devices may connect to the network 100 through a wired connection or wireless connection. Networked devices 110 may capture audio using one-or-more built-in or connected microphones 1014 or audio-capture devices, with processing performed by components of the same device 110 or another device/system 110/1100 connected via network 100. The concepts disclosed herein may be applied within a number of different devices and computer systems.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers will understand that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk or other media. In addition, components of one or more of the components and engines may be implemented as in firmware or hardware, such as the acoustic front end, which comprise among other things, analog or digital filters (e.g., filters configured as firmware to a digital signal processor (DSP)).

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements or steps. Thus, such conditional language is not generally intended to imply that features, elements, or steps are in any way required for one or more embodiments or that one or more embodiments necessarily include logic for deciding, with or without other input or prompting, whether these features, elements, or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method comprising:

receiving first data representing a hardware-description language (HDL) description of an electronic circuit;

identifying, using the first data, a first description of a first storage element configured to process, during a first time period, an input signal to store data associated with the input signal and to output, during a second time period, an output signal representing the data;

determining a memory structure configured to store the data;

determining a second description of a second storage element configured to store a reference value indicating a location of the data in the computer-memory structure, a topology of the second storage element corresponding to a topology of the first storage element;

determining, using the first data and the second description, a circuit model corresponding to the HDL description and the second storage element;

storing, using a first portion of the circuit model corresponding to the second storage element, the reference value; and processing, by the memory structure during the second time period, the reference value to output the data.

2. A computer-implemented method for modeling circuit behavior, the method comprising:

receiving first data representing a hardware-description language (HDL) description of a first electronic circuit;

identifying in the first data, a first representation of a first group of circuit elements corresponding to a circuit-element transformation technique;

determining a second representation of a second group of circuit elements by applying the circuit-element transformation technique to the first group of circuit elements;

identifying a second electronic circuit determined by replacing the first group of circuit elements in the first data with the second group of circuit elements;

simulating operation of the second electronic circuit to determine second data representing values of signals in the second electronic circuit;

determining a first signal corresponding to the first group of circuit elements;

determining a first time period corresponding to a first value of the first signal;

determining, using the circuit-element transformation technique, at least one second signal corresponding to the second group of circuit elements, wherein the second signal, at a second time period, corresponds to a representation of the first value; and determining using at least one value of the at least one second signal during the second time period and the circuit-element transformation technique, the first value, wherein the circuit-element transformation technique records a correspondence between the first group of circuit elements and the second group of circuit elements, the correspondence enabling a reverse transform to derive the first value from simulated values of signals of the second electronic circuit.

3. The computer-implemented method of claim 2, wherein the circuit-element transformation technique is reversible.

4. The computer-implemented method of claim 2, wherein the second group of circuit elements have an equivalent behavior to the first group of circuit elements.

5. The computer-implemented method of claim 2, wherein the circuit-element transformation technique corresponds to retiming of operation of at least one data-preserving element.

6. The computer-implemented method of claim 2, wherein the circuit-element transformation technique corresponds to migration of logic across at least one data-preserving element.

7. The computer-implemented method of claim 6, wherein the at least one data-preserving element comprises:

a multiplexer; and a flip-flop including:

an input driven by an output of the multiplexer, and an output connected to an input of the multiplexer.

8. The computer-implemented method of claim 6, wherein the data-preserving element comprises an array.

9. The computer-implemented method of claim 6, wherein the data-preserving element comprises a queue.

10. The computer-implemented method of claim 6, wherein the data-preserving element comprises a ring.

11. The computer-implemented method of claim 2, wherein the circuit-element transformation technique comprises time-domain multiplexing.

12. The computer-implemented method of claim 2, wherein the circuit-element transformation technique comprises storing data values in a storage array and configures a storage element to refer to a value stored in the storage array.

13. The computer-implemented method of claim 2, wherein the circuit-element transformation technique absorbs a storage element into a first-in-first-out (FIFO) component.

14. The computer-implemented method of claim 2, wherein the circuit-element transformation technique absorbs a storage element into a queue.

* * * * *